(12) United States Patent
Liou

(10) Patent No.: US 8,405,087 B2
(45) Date of Patent: Mar. 26, 2013

(54) PIXEL STRUCTURE

(75) Inventor: Meng-Chi Liou, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 13/615,652

(22) Filed: Sep. 14, 2012

(65) Prior Publication Data
US 2013/0009158 A1 Jan. 10, 2013

Related U.S. Application Data

(62) Division of application No. 12/575,478, filed on Oct. 8, 2009, now Pat. No. 8,304,771.

(30) Foreign Application Priority Data

Aug. 3, 2009 (TW) ................................ 98126119 A

(51) Int. Cl.
*H01L 29/10* (2006.01)
*H01L 29/04* (2006.01)
*H01L 31/0376* (2006.01)
*H01L 31/20* (2006.01)
*H01L 31/036* (2006.01)

(52) U.S. Cl. ............... 257/59; 257/71; 257/E33.053; 257/E33.044; 438/149; 438/151; 438/158; 438/159; 438/164; 349/38; 349/46; 349/129; 349/143

(58) Field of Classification Search .................. None
See application file for complete search history.

(56) References Cited

U.S. PATENT DOCUMENTS

| | | | | |
|---|---|---|---|---|
| 6,462,798 | B1 * | 10/2002 | Kim et al. | 349/129 |
| 6,750,935 | B2 * | 6/2004 | Seo et al. | 349/129 |
| 8,325,312 | B2 * | 12/2012 | Seo et al. | 349/155 |
| 2008/0258138 | A1 * | 10/2008 | Song et al. | 257/40 |

* cited by examiner

*Primary Examiner* — Telly Green
*Assistant Examiner* — Khanh Duong
(74) *Attorney, Agent, or Firm* — Jianq Chyun IP Office

(57) ABSTRACT

A pixel structure disposed on a substrate having an array of pixel areas is provided. The common electrode wire is positioned only in a portion of the pixel area. A first capacitance storage electrode is disposed in each of the pixel areas and electrically connected between two adjacent common electrode wires. A gate insulation layer covers the scan line, the gate electrode, the common electrode wire and the first capacitance storage electrode. A semiconductor layer is disposed on the gate insulation layer above the gate electrode. The source and the drain are disposed on two sides of the semiconductor layer. A passivation layer is disposed on the substrate to cover the data line, the source and the drain. The passivation layer above the drain has a contact window. A pixel electrode is electrically connected with the drain through the contact window.

6 Claims, 31 Drawing Sheets

PIXEL STRUCTURE

CROSS-REFERENCE TO RELATED APPLICATION

This application is a Divisional of and claims the priority benefit of U.S. patent application Ser. No. 12/575,478, filed on Oct. 8, 2009, now pending, which claims the priority benefits of Taiwan application Serial No. 98126119, filed Aug. 3, 2009. The entirety of the above-mentioned patent applications is hereby incorporated by reference herein and made a part of specification.

BACKGROUND OF THE INVENTION

1. Field of the Invention

The invention relates to a pixel structure and particularly relates to a pixel structure having high aperture ratio and favorable display quality.

2. Description of Related Art

With advantages of high definition, small size, light weight, low driving voltage, low power consumption, and an extensive range of application, a liquid crystal display (LCD) has replaced a cathode ray tube (CRT) display and becomes a mainstream among various display products. The conventional liquid crystal panel is formed by a color filter substrate, a thin-film transistor array substrate, and a liquid crystal layer disposed between the foregoing two substrates. To improve display quality, various layout designs of pixel structures for liquid crystal panels have been proposed.

FIG. 1 is a schematic top view of a conventional pixel structure. Referring to FIG. 1, a substrate 101 has an array of a plurality of pixel areas 102, and a pixel structure 100 is disposed in each of the pixel areas 102. In the drawing, only one of the pixel areas 102 is depicted for reference. The pixel structure 100 includes a scan line 110 and a gate electrode 112, a common electrode 114 and a common electrode 116, a semiconductor layer 122, a data line 130, a source 132 and a drain 134, and a pixel electrode 150. The common electrodes 114 and 116 are disposed to increase the storage capacitance in the pixel structure 100, so as to maintain the display quality.

The pixel structure 100 is a thin-film transistor pixel structure fabricated by conventional five photomask processes. The conventional five photomask processes include: a first photomask process for forming the scan line 110, the gate electrode 112, and the common electrodes 114 and 116; a second photomask process for forming the semiconductor layer 122; a third photomask process for forming the data line 130, the source 132, and the drain 134; a fourth photomask process for forming a contact window CH above the drain 134; and a fifth photomask process for forming the pixel electrode 150.

Because the scan line 110, the data line 130, the thin-film transistor (formed by the gate electrode 112, the source 132, and the drain 134), and the common electrodes 114 and 116 in the pixel structure 100 are formed by opaque metal layers, the aperture ratio of the pixel structure 100 is reduced by these opaque metal layers. Although the common electrodes 114 and 116 can increase the storage capacitance of the pixel structure 100, the aperture ratio of the pixel structure 100 is lowered as the area occupied by the common electrodes 114 and 116 in each pixel area increases.

When the pixel structure 100 is applied in a high-resolution portable liquid crystal display device, the space for each pixel area 102 is narrowed. As a consequence, the aperture ratio of the pixel structure 100 is limited to about 52%, which is lower than the aperture ratios of general televisions or monitors. To maintain the display brightness of the pixel structure 100, it is required to increase intensity of light sources in the display device, which is a waste of energy.

In addition, the common electrode 114 and the scan line 110 of the pixel structure 100 are formed on the substrate 101 at the same time. When the common electrode 114 and the scan line 110 are close to each other, short circuit may easily occur between the common electrode 114 and the scan line 110, which reduces the yield rate of the production.

SUMMARY OF THE INVENTION

The invention provides a pixel structure having higher aperture ratio and favorable display quality.

The invention provides a method for fabricating the pixel structure and increasing yield rate.

Based on the above, the invention provides a method for fabricating a pixel structure. The method includes the following Steps (A) (K). Step (A): a substrate having an array of a plurality of pixel areas is provided. Step (B): a common electrode is formed on the substrate to surround each of the pixel areas. Step (C): a capacitance storage electrode is formed on the common electrode. Step (D): a first passivation layer is formed to cover the capacitance storage electrode and the common electrode. Step (E): a scan line and a gate electrode are formed in each of the pixel areas. Step (F): a gate insulation layer is formed to cover the scan line and the gate electrode. Step (G): a semiconductor layer is formed on the gate insulation layer above the gate electrode. Step (H): a data line, a source, and a drain are formed in each of the pixel areas; and the source and the drain are formed on two sides of the semiconductor layer. Step (I): a second passivation layer is formed on the substrate to cover the data line, the source, and the drain. Step (J): a contact window is formed in the second passivation layer above the drain to expose the drain. Step (K): a pixel electrode is formed in each of the pixel areas, and the pixel electrode is electrically connected with the drain through the contact window.

The invention provides a pixel structure that is disposed on a substrate. The substrate includes an array of a plurality of pixel areas, and the pixel structure is disposed in each of the pixel areas. The pixel structure includes a common electrode, a capacitance storage electrode, a first passivation layer, a scan line and a gate electrode, a gate insulation layer, a semiconductor layer, a data line, a source and a drain, a second passivation layer, and a pixel electrode. The common electrode is disposed above the substrate and surrounds each of the pixel areas. The capacitance storage electrode is disposed on the common electrode. The first passivation layer covers the capacitance storage electrode and the common electrode. The scan line and the gate electrode are disposed in each of the pixel areas. The gate insulation layer covers the scan line and the gate electrode. The semiconductor layer is disposed on the gate insulation layer above the gate electrode. The data line, the source, and the drain are disposed in each of the pixel areas. Moreover, the source and the drain are disposed on two sides of the semiconductor layer. The second passivation layer covers the data line, the source, and the drain, wherein a contact window is formed in the second passivation layer above the drain. The pixel electrode is disposed in each of the pixel areas, and the pixel electrode is electrically connected with the drain through the contact window.

The invention provides a method for fabricating a pixel structure. First, a substrate having an array of a plurality of pixel areas is provided. Next, a scan line, a gate electrode, and at least a common electrode wire are formed in each of the pixel areas, wherein the common electrode wire is positioned only in a portion of the pixel area. Thereafter, a first capacitance storage electrode is formed in each of the pixel areas. The first capacitance storage electrode is electrically connected between two adjacent common electrode wires. Then, a gate insulation layer is formed to cover the scan line, the gate electrode, the common electrode wire, and the first capacitance storage electrode. Following that, a semiconductor layer is formed on the gate insulation layer above the gate electrode. Next, a data line, a source, and a drain are formed in each of the pixel areas. The source and the drain are formed on two sides of the semiconductor layer. Further, a passivation layer is formed on the substrate to cover the data line, the source, and the drain. Then, a contact window is formed in the passivation layer above the drain to expose the drain. Thereafter, a pixel electrode is formed in each of the pixel areas, and the pixel electrode is electrically connected with the drain through the contact window.

The invention provides a pixel structure that is disposed on a substrate. The substrate includes an array of a plurality of pixel areas, and the pixel structure is disposed in each of the pixel areas. The pixel structure includes a scan line, a gate electrode, at least a common electrode wire, a first capacitance storage electrode, a gate insulation layer, a semiconductor layer, a data line, a source, a drain, a passivation layer, and a pixel electrode. The scan line, the gate electrode, and at least one common electrode wire are disposed in each of the pixel areas, wherein the common electrode wire is positioned only in a portion of the pixel area. The first capacitance storage electrode is disposed in each of the pixel areas, and the first capacitance storage electrode is electrically connected between two adjacent common electrode wires. The gate insulation layer covers the scan line, the gate electrode, the common electrode wire, and the first capacitance storage electrode. The semiconductor layer is disposed on the gate insulation layer above the gate electrode. The data line, the source, and the drain are disposed in each of the pixel areas. Moreover, the source and the drain are disposed on two sides of the semiconductor layer. The passivation layer is disposed on the substrate and covers the data line, the source, and the drain, wherein the passivation layer above the drain has a contact window. The pixel electrode is electrically connected with the drain through the contact window.

In the pixel structure of the invention, the common electrode and the capacitance storage electrode are disposed around the pixel areas and corresponding to the scan line and the data line. Therefore, the common electrode does not shield the central parts of the pixel areas. As a consequence, the aperture ratio of the pixel structure is increased. Also, the storage capacitance formed therein can maintain favorable display quality. Moreover, compared with the conventional technology, the fabricating method of the pixel structure requires additional one to two photomask processes. That is, an additional photomask process is carried out to form the common electrode and the capacitance storage electrode. Since the common electrode and the scan line are not fabricated by the same photomask process, the short circuit between the common electrode and the scan line can be prevented.

In order to make the aforementioned and other features and advantages of the invention more comprehensible, several embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The invention uses more photomask processes for preventing the loss of aperture ratio caused by disposing the common electrode, thereby fabricating a pixel structure having high aperture ratio and favorable display quality. Particularly, since the common electrode and the scan line are not formed by the same photomask process, the short circuit between the common electrode and the scan line can be prevented. Moreover, because a capacitance storage electrode is disposed on the common electrode directly, the pixel structure has satisfactory storage capacitance. Several exemplary embodiments of the invention are described below with reference to the attached drawings.

First Embodiment

Figure 1:
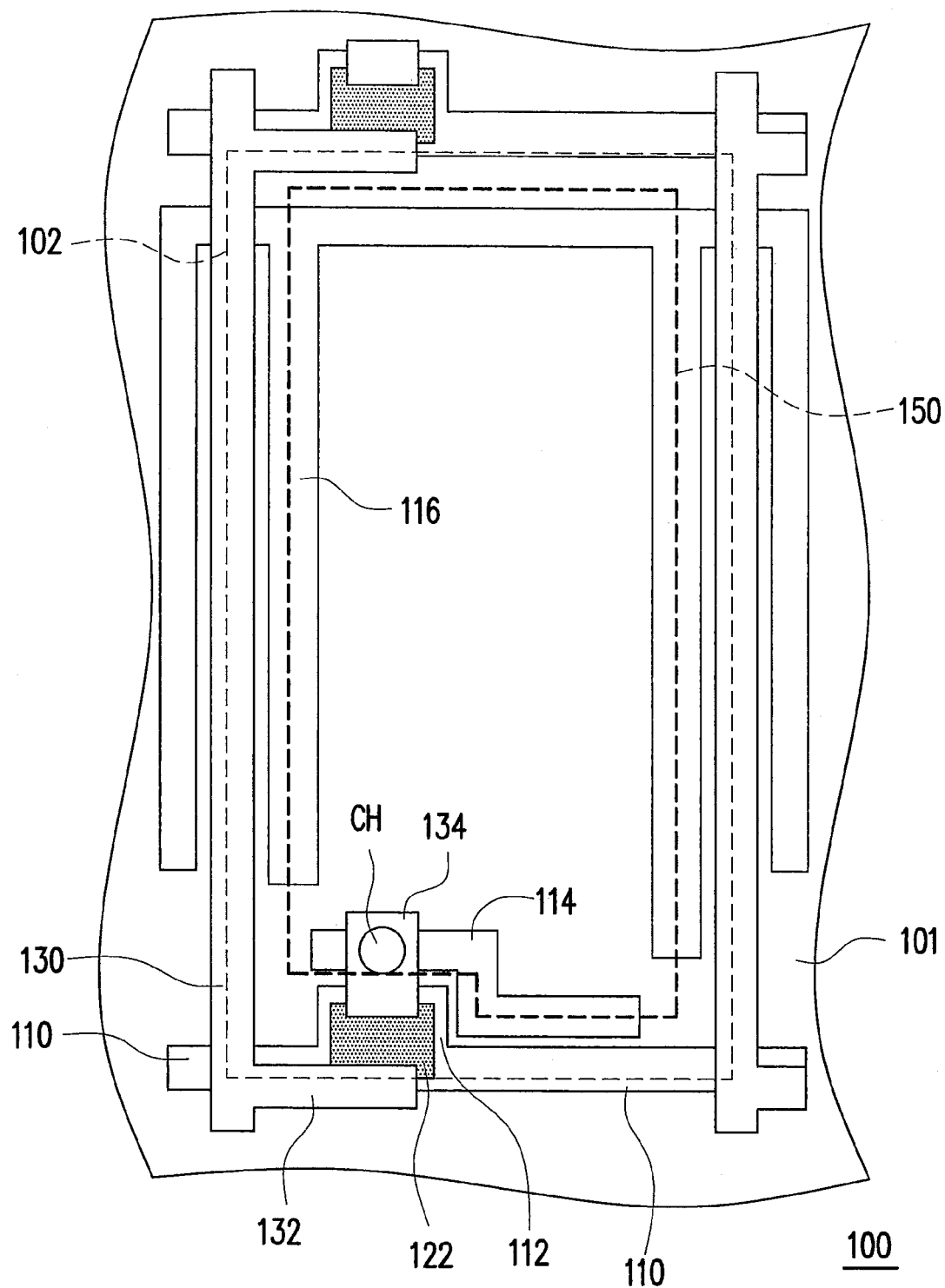
FIG. 1 is a schematic top view of a conventional pixel structure.
Figure 2:
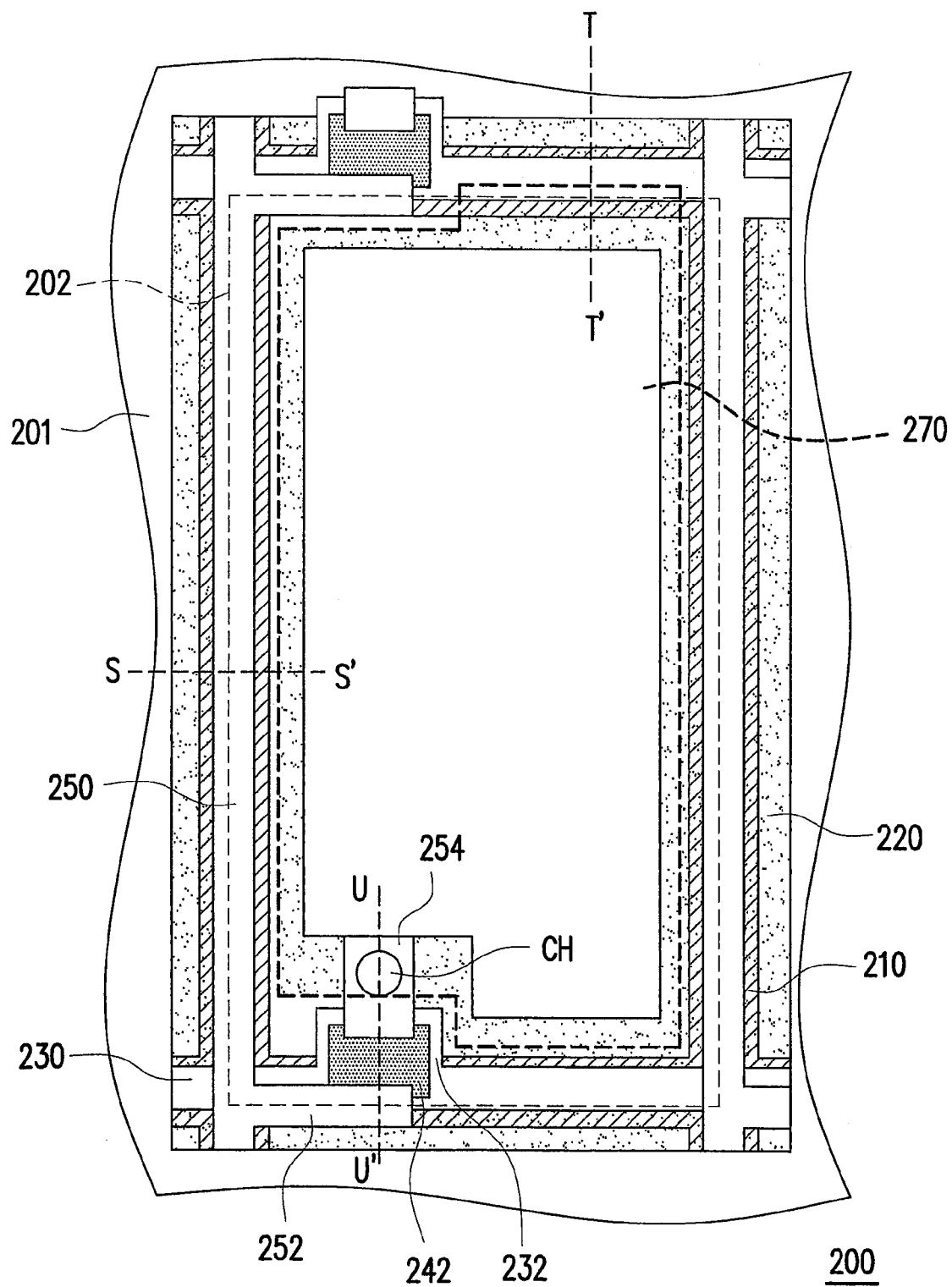
FIG. 2 is a schematic top view of a pixel structure according to the first embodiment of the invention.
Figure 3A:
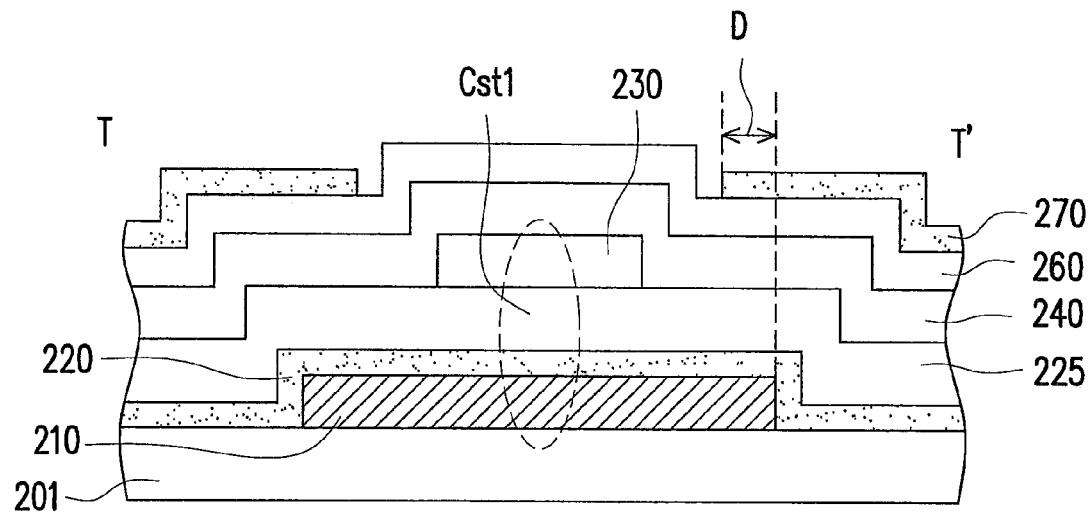
FIG. 3A~FIG. 3C are schematic cross-sectional views along Lines T-T', S-S', and U-U' in FIG. 2.
Figure 3B:
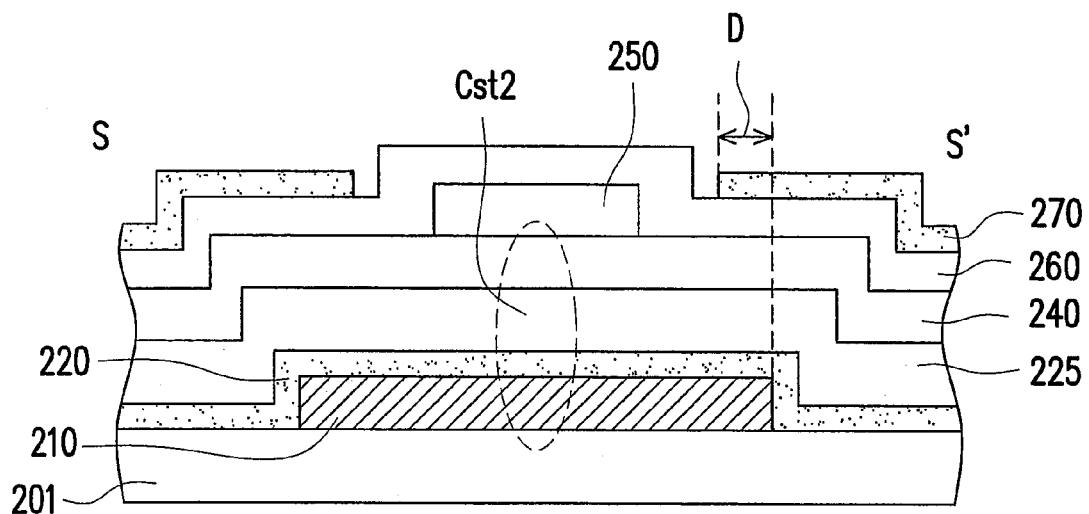
Figure 3C:
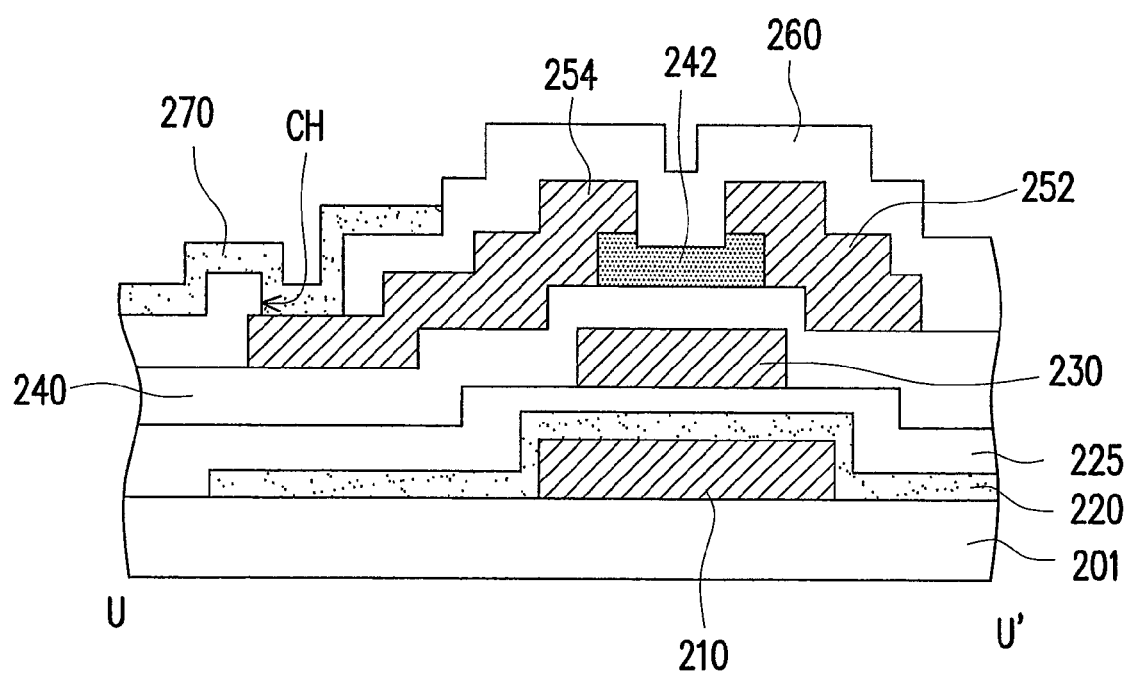

FIG. 2 is a schematic top view of a pixel structure according to the first embodiment of the invention. FIG. 3A~FIG. 3C are schematic cross-sectional views along Lines T-T', S-S', and U-U' in FIG. 2 respectively.

Referring to FIG. 2 and FIG. 3A~FIG. 3C, a pixel structure 200 is disposed on a substrate 201. The substrate 201 includes an array of a plurality of pixel areas 202, and the pixel structure 200 is disposed in each of the pixel areas 202. In order to simplify the description, FIG. 2 only depicts one of the pixel areas 202. The pixel structure 200 includes: a common electrode 210, a capacitance storage electrode 220, a first passivation layer 225 (shown in FIGS. 3A~3C), a scan line 230 and a gate electrode 232, a gate insulation layer 240, a semiconductor layer 242, a data line 250, a source 252 and a drain 254, a second passivation layer 260 (shown in FIGS. 3A~3C), and a pixel electrode 270.

The common electrode 210 is disposed above the substrate 201 and surrounds each of the pixel areas 202. The capacitance storage electrode 220 is disposed on the common electrode 210. The first passivation layer 225 covers the capacitance storage electrode 220 and the common electrode 210. The scan line 230 and the gate electrode 232 are disposed in each of the pixel areas 202. The gate insulation layer 240 covers the scan line 230 and the gate electrode 232. The semiconductor layer 242 is disposed on the gate insulation layer 240 above the gate electrode 232. The data line 250, the source 252, and the drain 254 are disposed in each of the pixel areas 202. Moreover, the source 252 and the drain 254 are disposed on two sides of the semiconductor layer 242. The second passivation layer 260 covers the data line 250, the source 252, and the drain 254, wherein a contact window CH is formed in the second passivation layer 260 above the drain 254. The pixel electrode 270 is disposed in each of the pixel areas 202, and the pixel electrode 270 is electrically connected with the drain 254 through the contact window CH.

In this embodiment, the common electrode 210 is disposed to surround each of the pixel areas 202 and located under the scan line 230 and the data line 250. Therefore, the common electrode 210 serves as a black matrix on a thin-film transistor array substrate (BM On Array). Since a light passing through a central part of each of the pixel areas 202 is not shielded by the common electrode 210, the pixel structure 200 has higher aperture ratio. In one embodiment of the invention, the aperture ratio of the pixel structure 200 is up to about 76%.

Materials and film thicknesses of the elements of the pixel structure 200 are described in the following embodiments. A material of the common electrode 210 can be metal or alloy, for example, Cr or Mo, and a thickness thereof is 2,250 Å~2,750 Å. A material of the capacitance storage electrode 220 can be transparent conductive material, for example, indium tin oxide (ITO) or indium zinc oxide (IZO), and a thickness thereof is 900 Å~1,100 Å. A material of the first passivation layer 225 is silicon nitride, and a thickness thereof is 4,500 Å~5,500 Å, for example.

The materials of the scan line 230 and the gate electrode 232 can be metal or alloy, for example, Cr or Mo, and the thicknesses thereof are 2,250 Å~2,750 Å respectively. A material of the gate insulation layer 240 can be insulation material, for example, silicon nitride, and a thickness thereof is 3,600 Å~4,400 Å. A material of the semiconductor layer 242 is amorphous silicon, and a thickness thereof is 1,800 Å~2,200 Å, for example. In one embodiment not illustrated thereinafter, the semiconductor layer 242 includes a channel layer and an ohm contact layer, for instance. More specifically, the channel layer is disposed on the gate insulation layer 240 above the gate electrode 232, and the ohm contact layer is disposed on the channel layer.

A material of the data line 250, the source 252, and the drain 254 can be metal or alloy, for example, Cr or Mo, and the thicknesses of the data line 250, the source 252, and the drain are 2,250 Å~2,750 Å respectively. A material of the second passivation layer 260 is silicon nitride, and a thickness thereof is 2,700 Å~3,300 Å, for example. A material of the pixel electrode 270 can be transparent conductive material, for example, indium tin oxide (ITO) or indium zinc oxide (IZO), and a thickness thereof is 900 Å~1,100 Å.

With reference to FIG. 2 and FIG. 3A~FIG. 3C, in the pixel structure 200, the capacitance storage electrode 220 is disposed corresponding to the scan line 230. The capacitance storage electrode 220, the first passivation layer 225, and the scan line 230 form a first storage capacitance Cst1. Moreover, the capacitance storage electrode 220 is disposed corresponding to the data line 250 as well. The capacitance storage electrode 220, the first passivation layer 225, the second passivation layer 240, and the data line 250 form a second storage capacitance Cst2. The capacitance storage electrode 220 extends into each of the pixel areas 202 and overlaps the pixel electrode 270 in a peripheral portion of the pixel area 202.

In this embodiment, the capacitance storage electrode 220 is formed by a transparent material. Therefore, the portion covered by the capacitance storage electrode 220 does not have much influence on the aperture ratio of the pixel structure 200. Moreover, the capacitance storage electrode 220 can be disposed to cover a large area in each of the pixel areas 202, so as to greatly increase the storage capacitance of the pixel structure 200. In other words, the pixel structure 200 has favorable display quality and higher aperture ratio.

The pixel electrode 270 and the common electrode 210 have an overlap distance D at the periphery of each of the pixel areas 202. This design prevents light leakage which results from deflection of liquid crystal molecules caused by a non-uniform electric field. In some of the embodiments, the overlap distance D of the pixel electrode 270 and the common electrode 210 is 2 micrometers, for instance. However, it is noted that the invention does not limit a length of the overlap distance D or a position of an overlap of the pixel electrode 270 and the common electrode 210.

The following serves to describe a method for fabricating the aforementioned pixel structure 200.

FIG. 4A~FIG. 4H illustrate a method of fabricating the pixel structure according to the first embodiment of the invention. In order to simplify the description, only one of the pixel areas is depicted in the drawings.

Figure 4A:
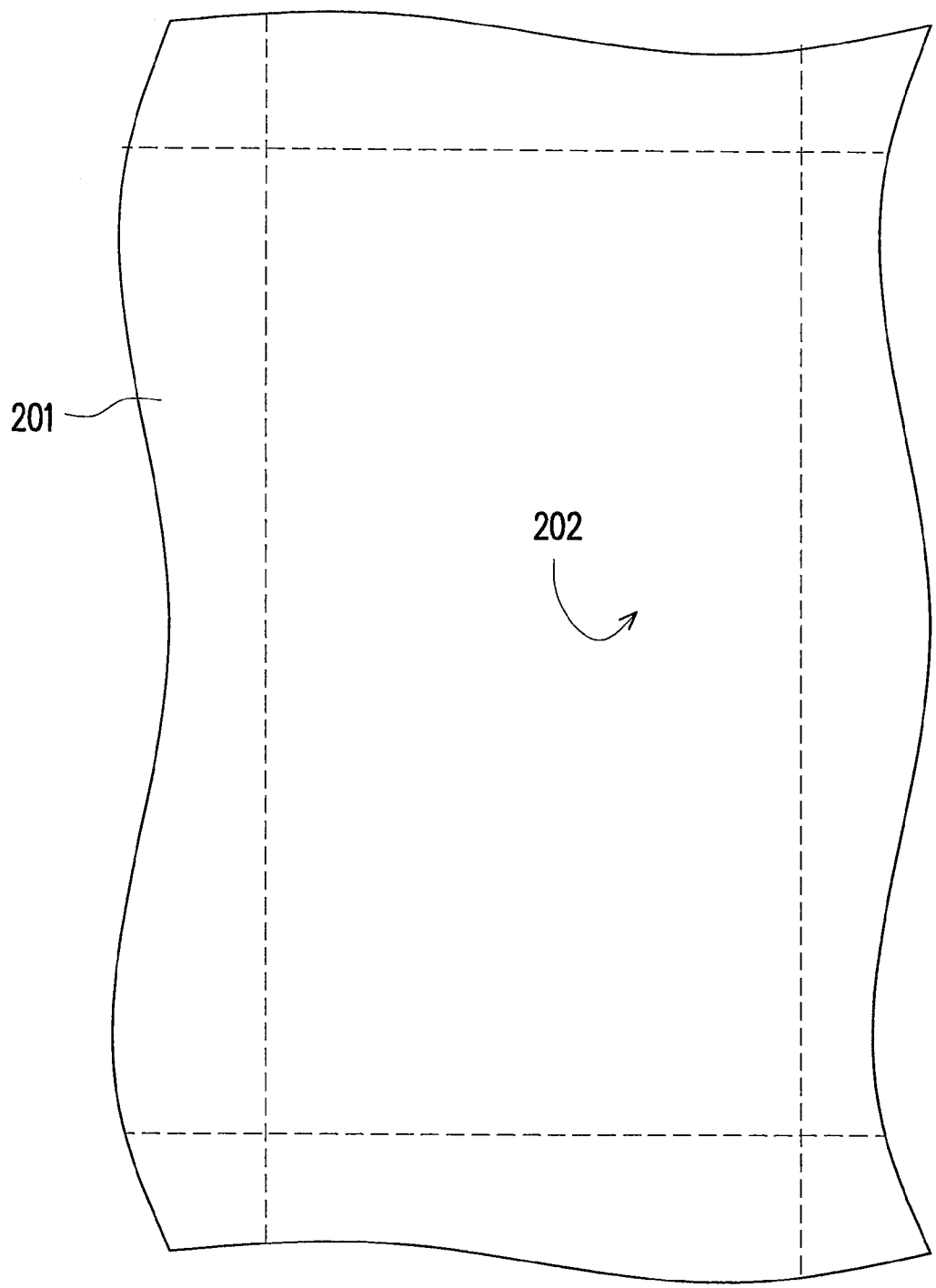
FIG. 4A~FIG. 4H illustrate a method of fabricating the pixel structure according to the first embodiment of the invention.

First, referring to FIG. 4A, Step (A) is carried out, and the substrate 201 is provided. The substrate 201 includes an array of a plurality of pixel areas 202.

Figure 4B:
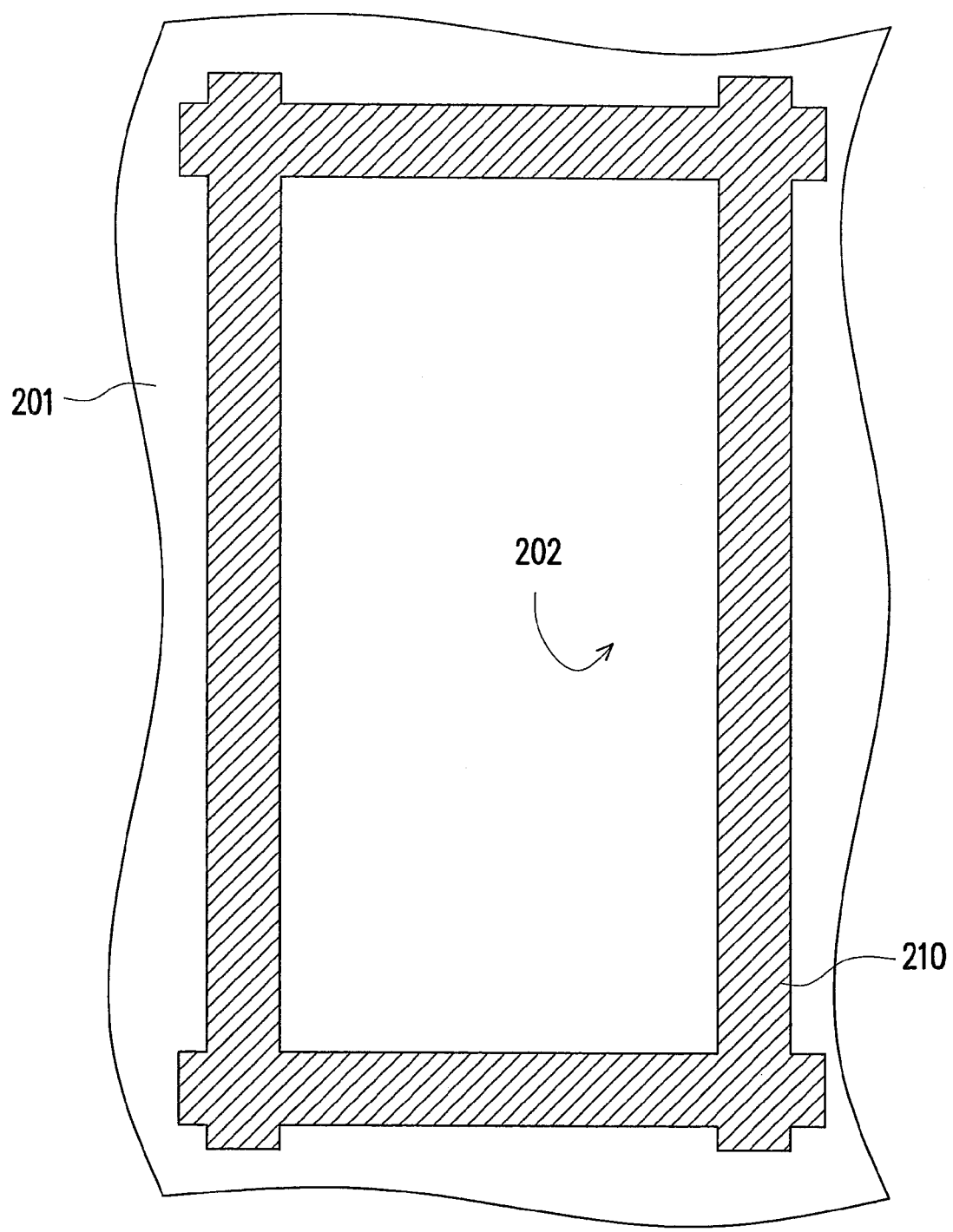

Next, referring to FIG. 4B, Step (B) is carried out, and the common electrode 210 is formed on the substrate 201 to surround each of the pixel areas 202. A method for forming the common electrode 210 is, for example, applying a metal layer (not shown) completely over the substrate 201. Thereafter, the metal layer is patterned by photolithography and etching processes.

Figure 4C:
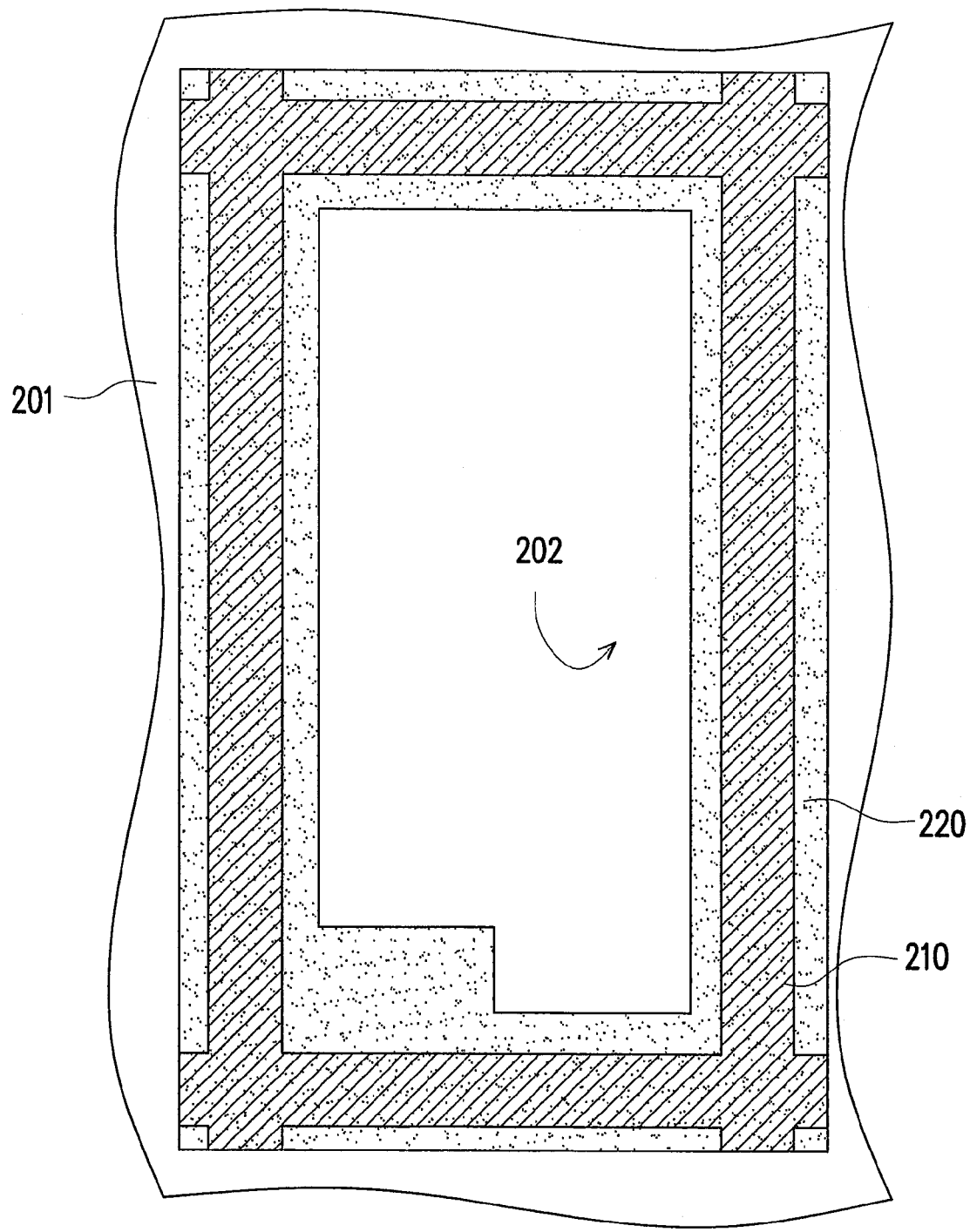

Then, referring to FIG. 4C, Step (C) is carried out, and the capacitance storage electrode 220 is formed on the common electrode 210. A method for fabricating the capacitance storage electrode 220 is, for instance: forming a transparent conductive layer (not shown) completely over the substrate 201 by a sputtering process, and patterning the transparent conductive layer by photolithography and etching processes.

Following that, Step (D) is carried out, and the first passivation layer 225, as shown in FIGS. 3A~3C, is formed completely over the substrate 201 to cover the capacitance storage electrode 220 and the common electrode 210.

Figure 4D:
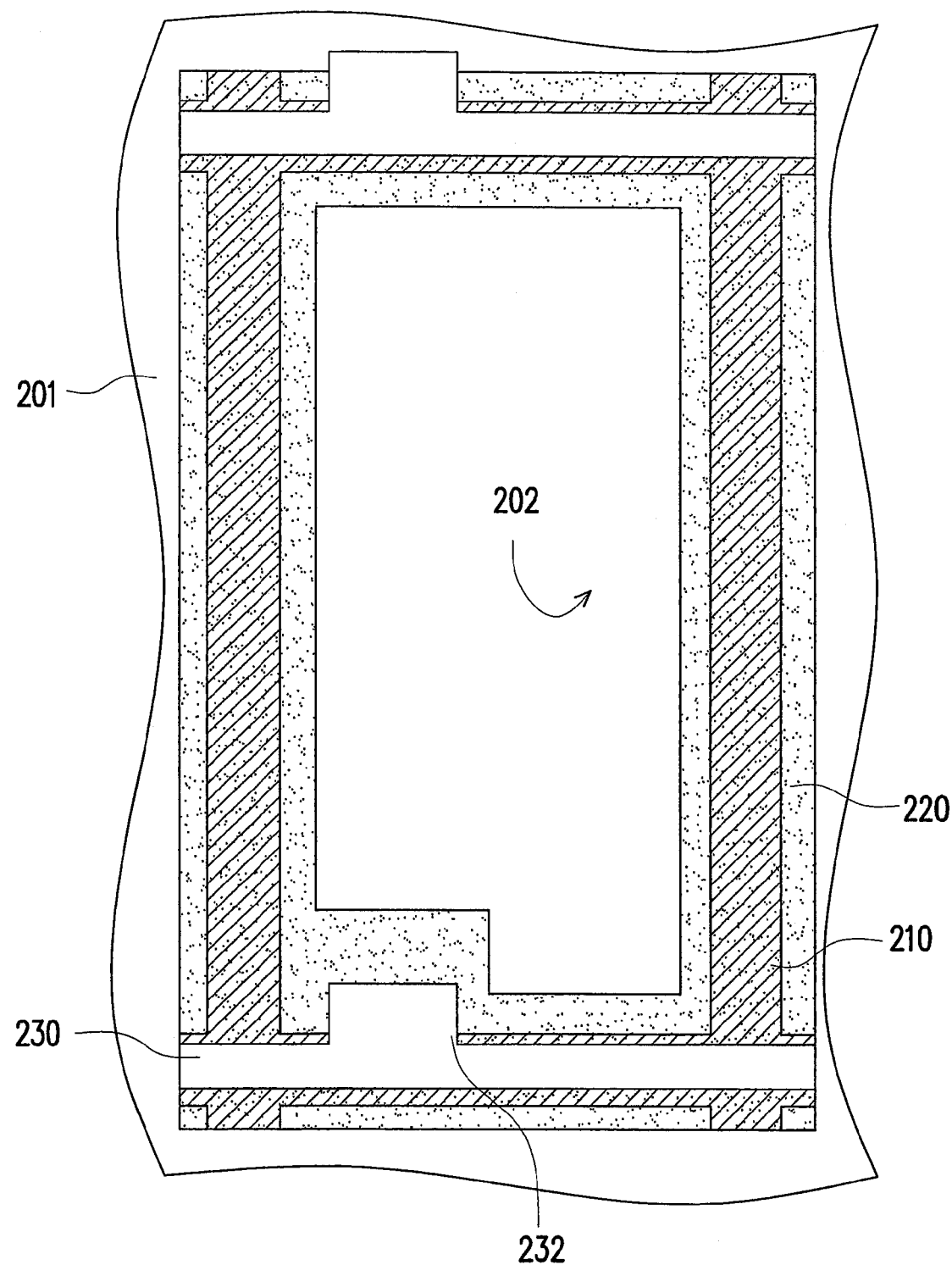

Further, referring to FIG. 4D, Step (E) is carried out. The scan line 230 and the gate electrode 232 are formed in each of the pixel areas 202.

Next, in Step (F), the gate insulation layer 240, as shown in FIGS. 3A~3C, is formed completely over the substrate 201 to cover the scan line 230 and the gate electrode 232.

Figure 4E:
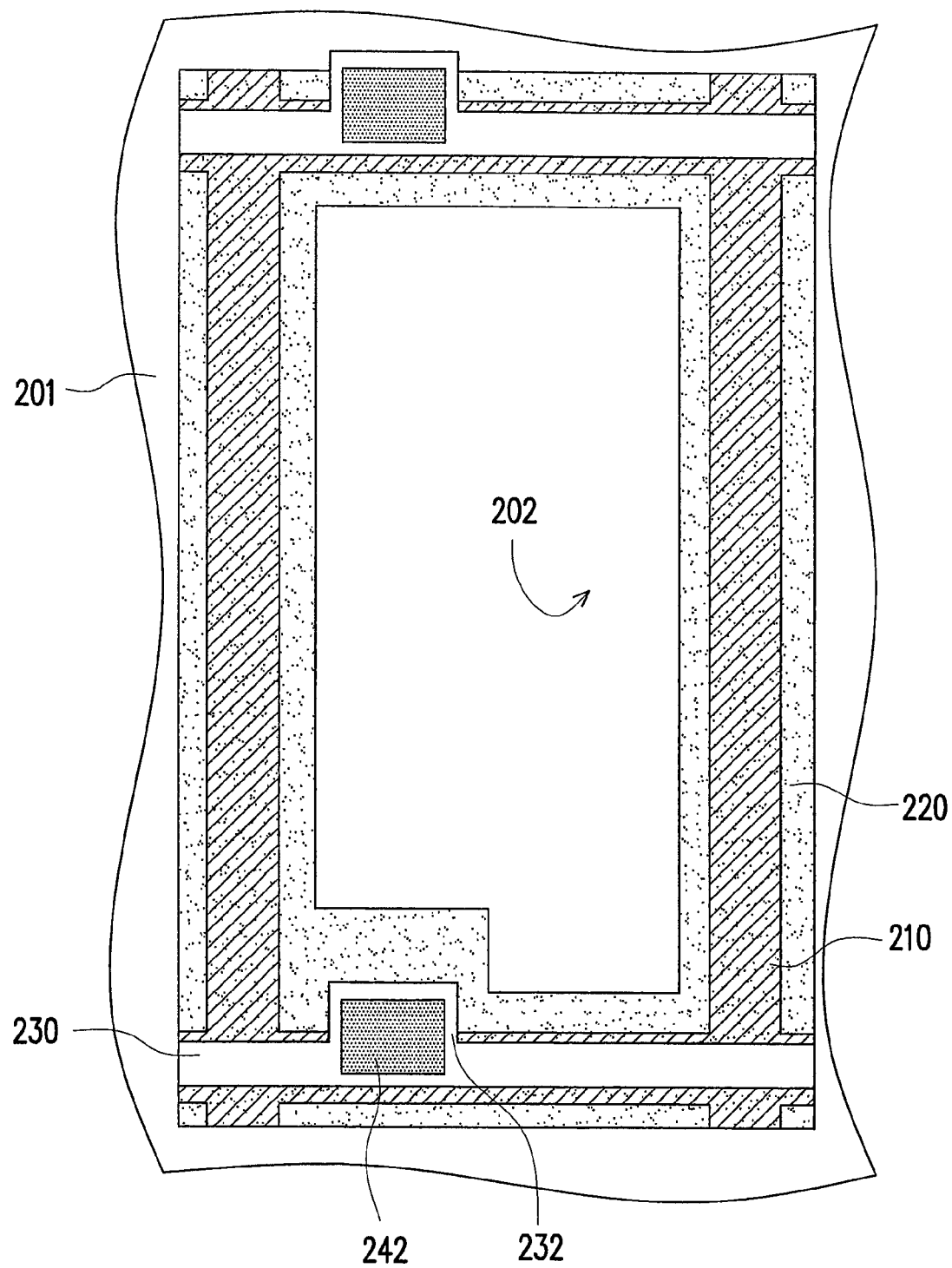

Referring to FIG. 4E, Step (G) is then performed to form the semiconductor layer 242 on the gate insulation layer 240 above the gate electrode 232. A method for fabricating the semiconductor layer 242 is, for example, forming a channel layer (not shown) on the gate insulation layer 240 above the gate electrode 232, and then forming an ohm contact layer (not shown) on the channel layer.

Figure 4F:
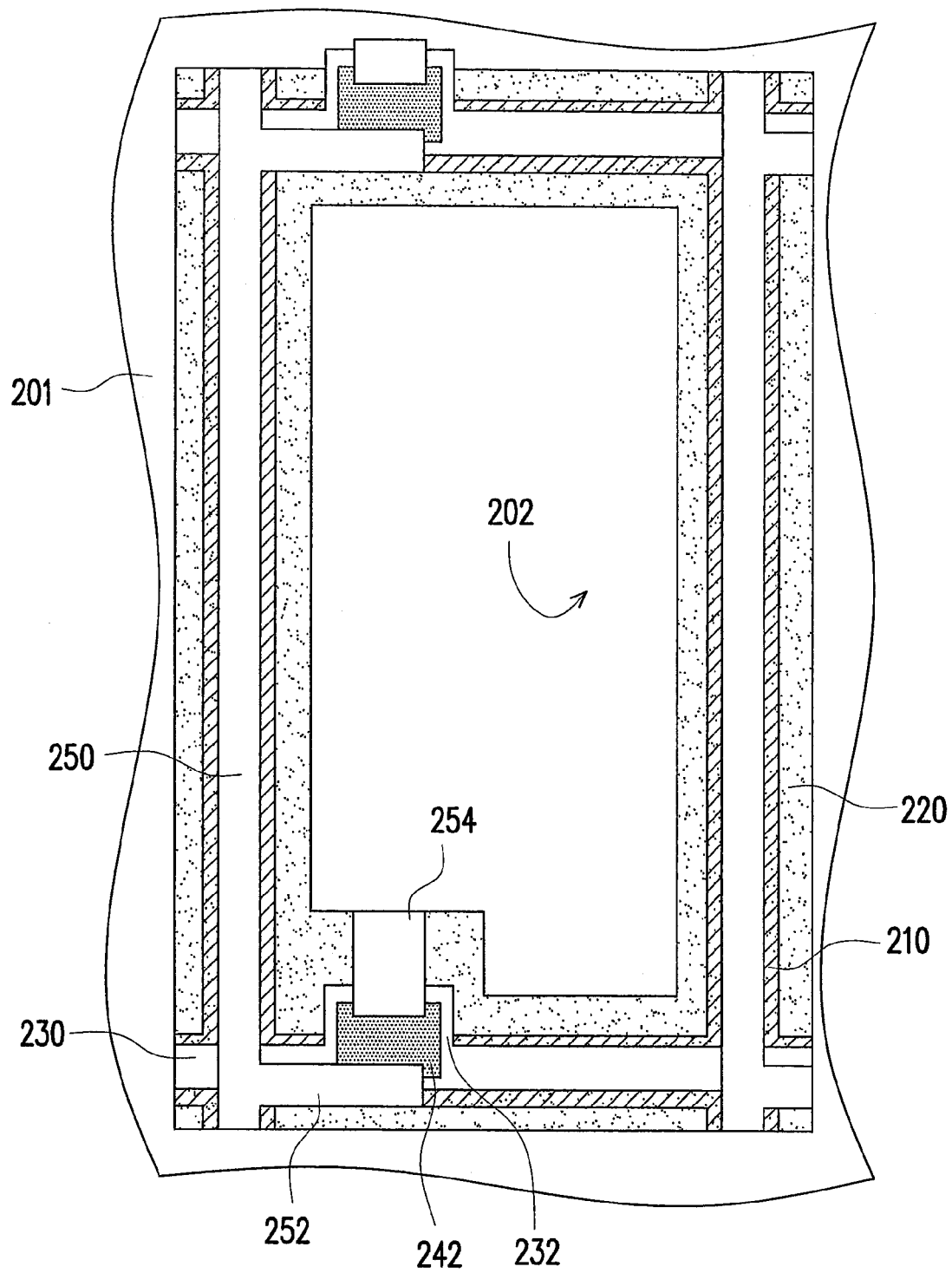

Thereafter, in FIG. 4F, Step (H) is carried out to form the data line 250, the source 252, and the drain 254 in each of the pixel areas 202, wherein the source 252 and the drain 254 are formed on two sides of the semiconductor layer 242.

Next, in Step (I), the second passivation layer 260, as shown in FIGS. 3A~3C, is formed completely over the substrate 201 to cover the data line 250, the source 252, and the drain 254.

Figure 4G:
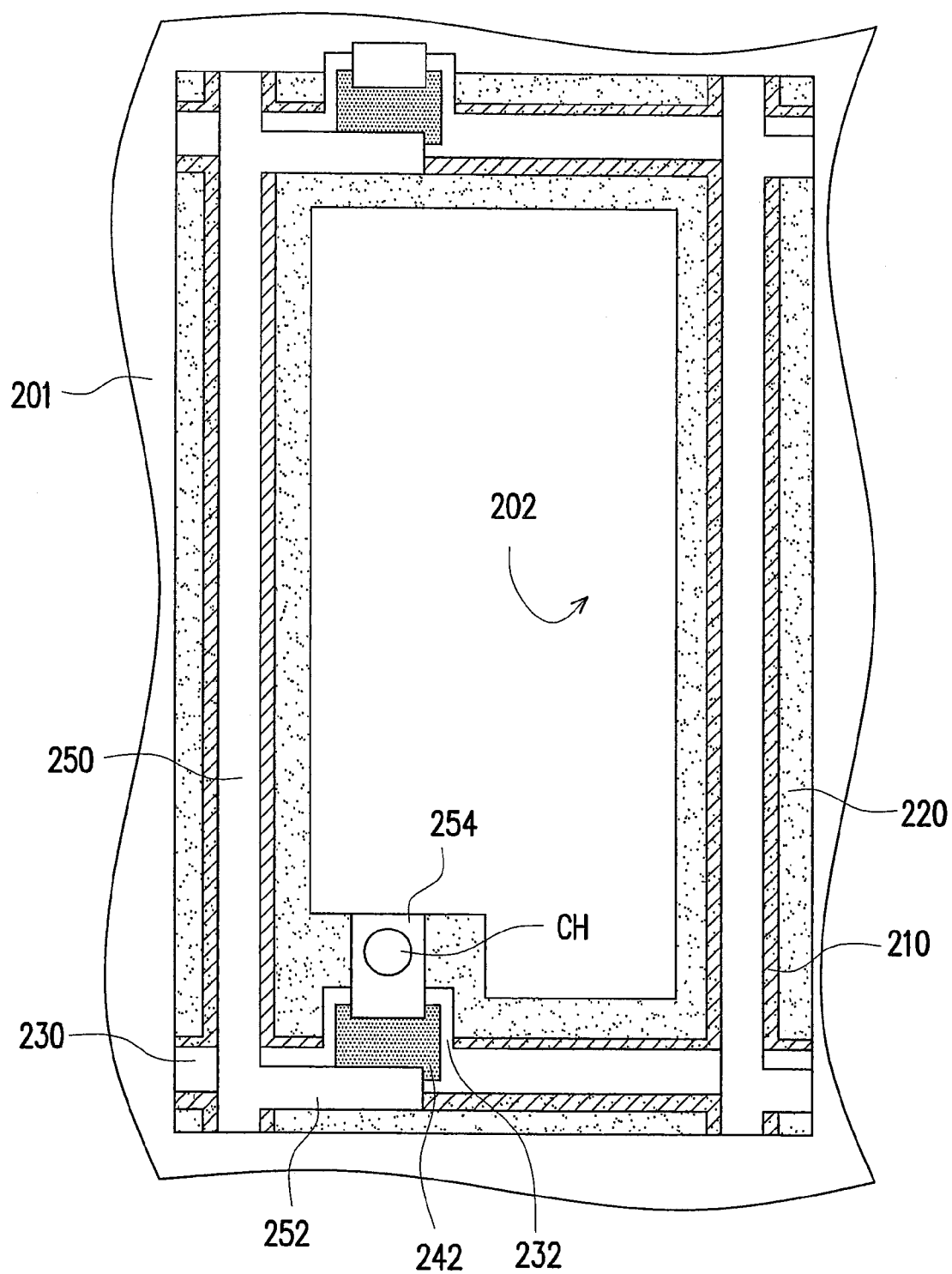
Figure 4H:
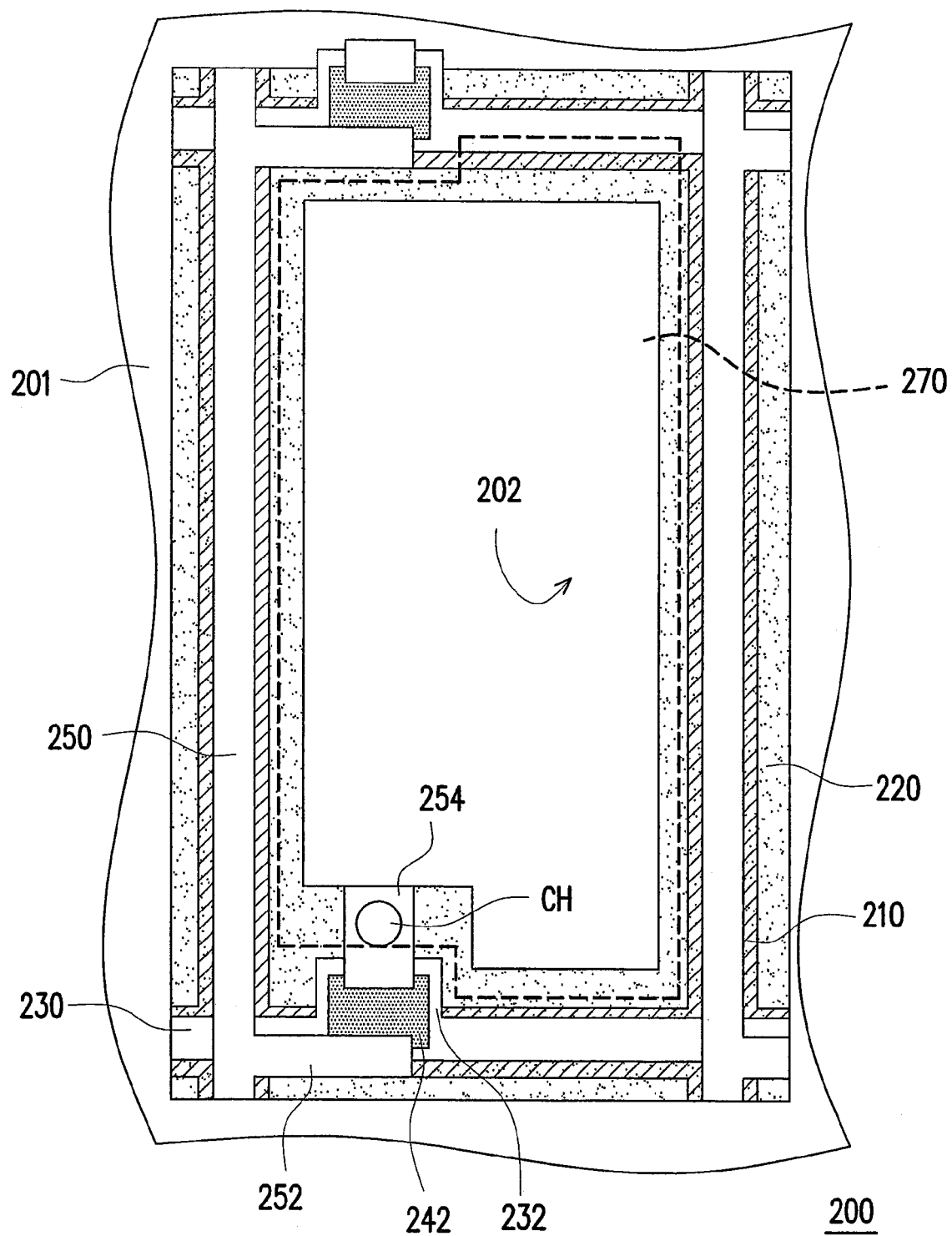

Following that, Step (J) is performed as in FIG. 4G, and the contact window CH is formed in the second passivation layer 260 above the drain 254 to expose the drain 254 (also see FIGS. 3A~3C).

Then, with reference to FIG. 4H and FIGS. 3A~3C, Step (K) is carried out, and the pixel electrode 270 (represented by dash lines in the drawings) is formed in each of the pixel areas 202. The pixel electrode 270 is electrically connected with the drain 254 through the contact window CH. Accordingly, the fabrication of the pixel structure 200 is completed.

Compared with the conventional technology, additional steps are added to the fabricating method in the first embodiment of the invention, so as to form the common electrode 210 and the capacitance storage electrode 220. In other words, seven photomask processes are carried out to fabricate the pixel structure 200 in the first embodiment of the invention. However, it is noted that the invention does not limit the number of the photomask processes during the fabrication.

Since the common electrode 210 and the scan line 230 are not formed by the same photomask process, the short circuit between the common electrode 210 and the scan line 230 is prevented.

Second Embodiment

Figure 5:
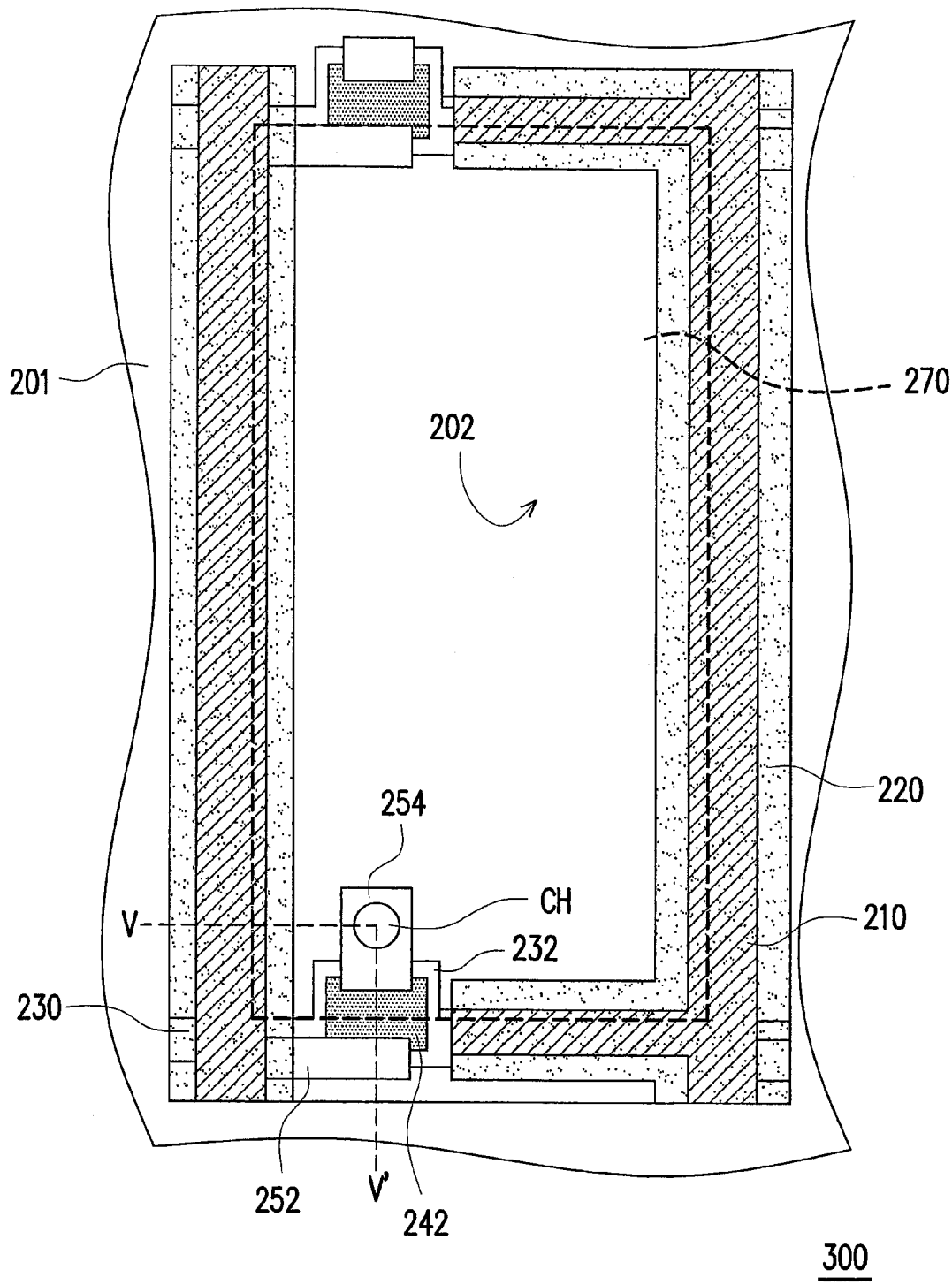
FIG. 5 is a schematic top view of a pixel structure according to the second embodiment of the invention.
Figure 6:
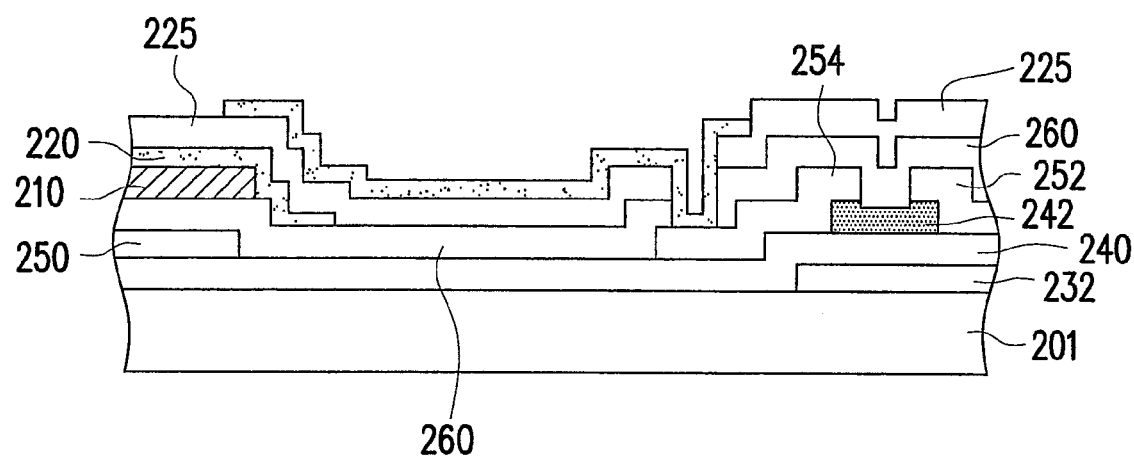
FIG. 6 is a schematic cross-sectional view along Line V-V' in FIG. 5.

FIG. 5 is a schematic top view of a pixel structure according to the second embodiment of the invention. FIG. 6 is a schematic cross-sectional view along Line V-V' in FIG. 5.

Referring to FIG. 5 and FIG. 6, a pixel structure 300 is similar to the pixel structure 200 in the first embodiment, wherein identical elements are referred to by the same reference numbers, and detailed descriptions thereof are omitted hereinafter. A difference between the pixel structure 300 and the pixel structure 200 lies in that: in the pixel structure 300, the common electrode 210, the capacitance storage electrode 220, and the first passivation layer 225 are disposed sequentially from bottom to top on the second passivation layer 260; further, the contact window CH is formed in the second passivation layer 260 and the first passivation layer 240 above the drain 254, so as to expose the drain 254.

FIGS. 7A~7H illustrate a method of fabricating the pixel structure according to the second embodiment of the invention. In order to simplify the description, only one of the pixel areas is depicted in the drawings. Steps (A)~(K) in the following descriptions are substantially the same as the steps described in the first embodiment. However, the sequences of carrying out these steps are different between the two embodiments. FIGS. 6 and 7A~7H are to further explain the fabricating method of the pixel structure in the second embodiment.

Figure 7A:
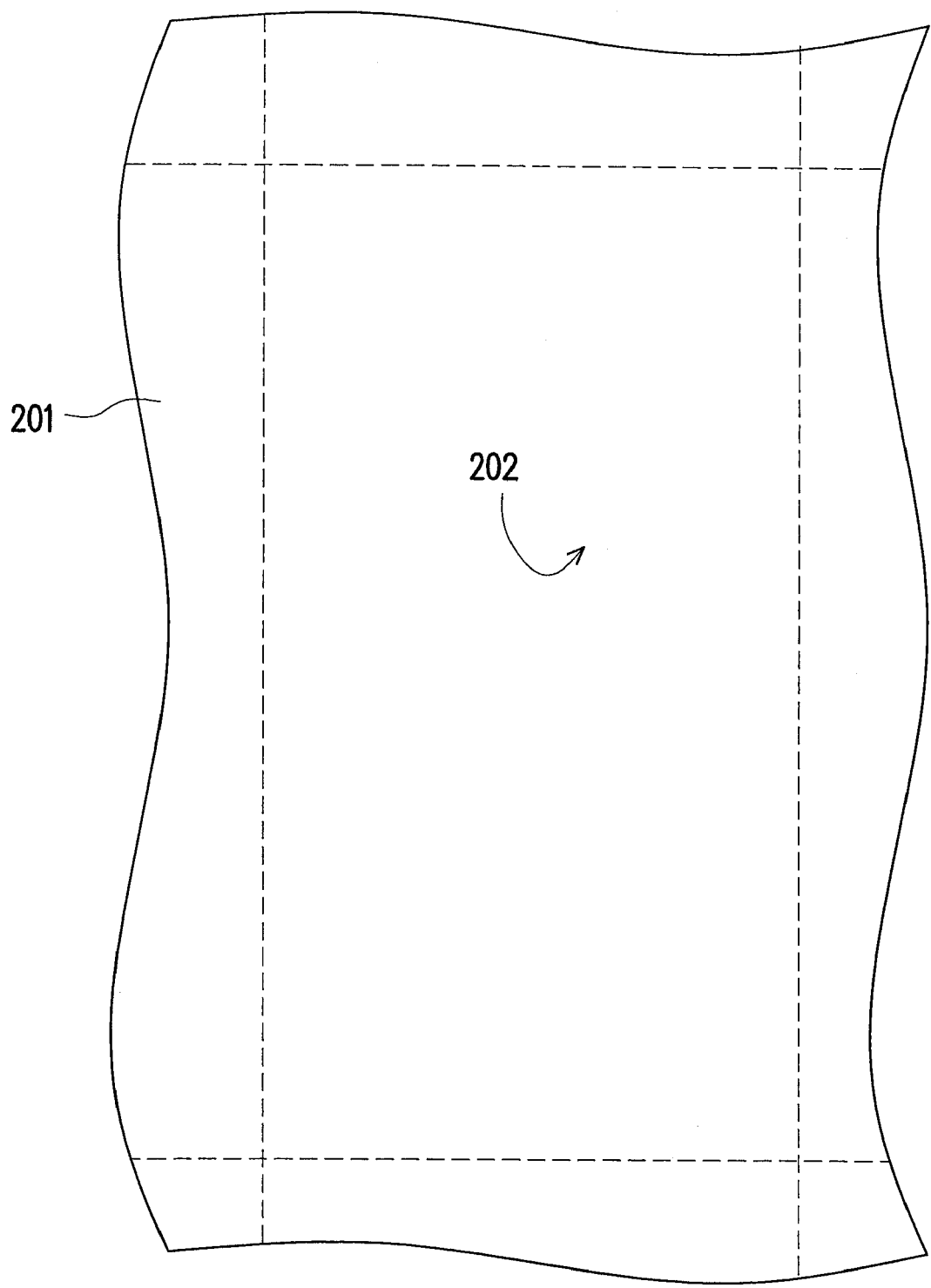
FIG. 7A~FIG. 7H illustrate a method of fabricating the pixel structure according to the second embodiment of the invention.

First, with reference to FIG. 7A, in Step (A), the substrate 201 is provided. The substrate 201 includes an array of a plurality of pixel areas 202.

Figure 7B:
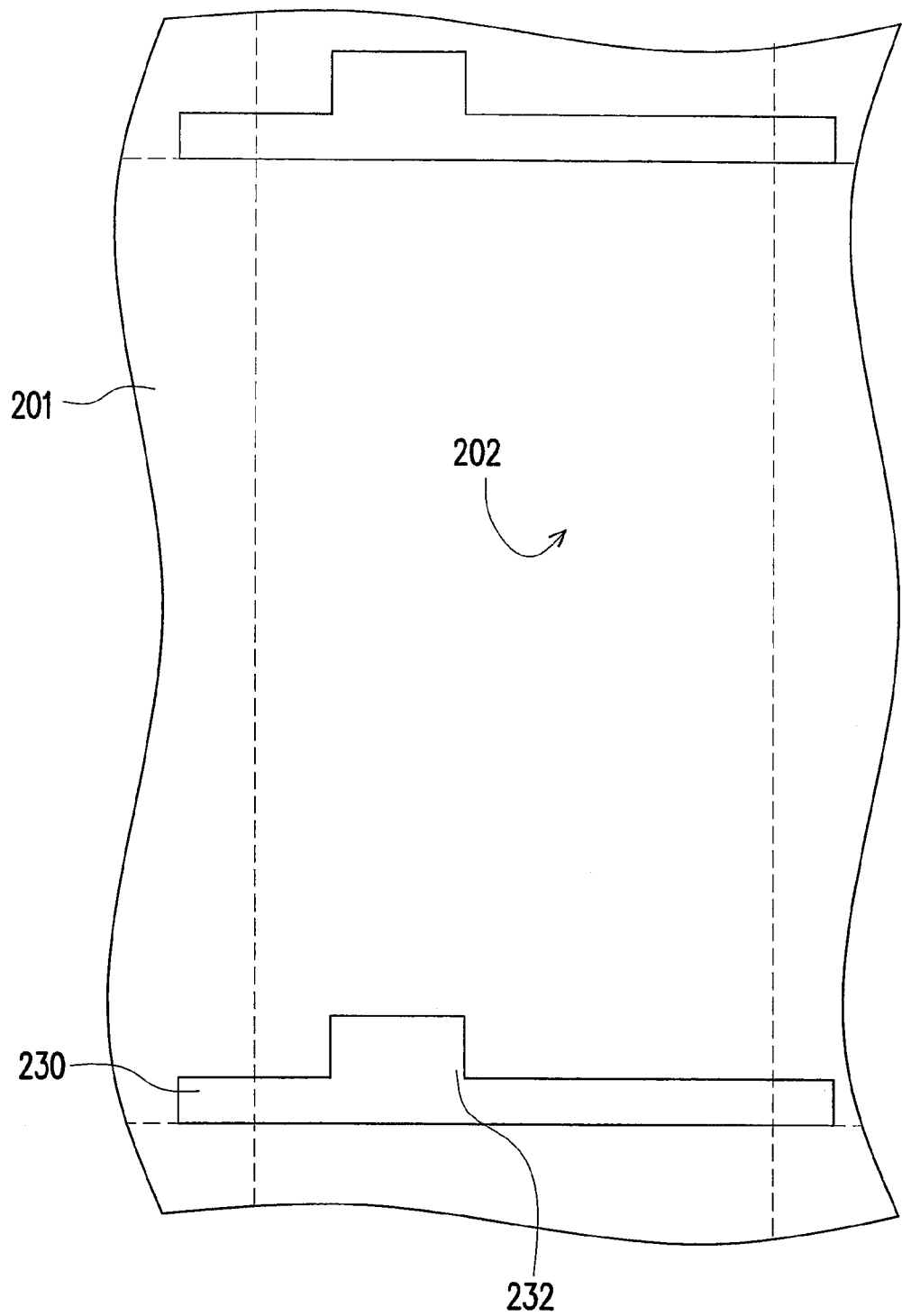

Further, referring to FIG. 7B, Step (E) is carried out, wherein the scan line 230 and the gate electrode 232 are formed in each of the pixel areas 202.

Next, in Step (F), the gate insulation layer 240, as shown in FIG. 6, is formed completely over the substrate 201 to cover the scan line 230 and the gate electrode 232.

Figure 7C:
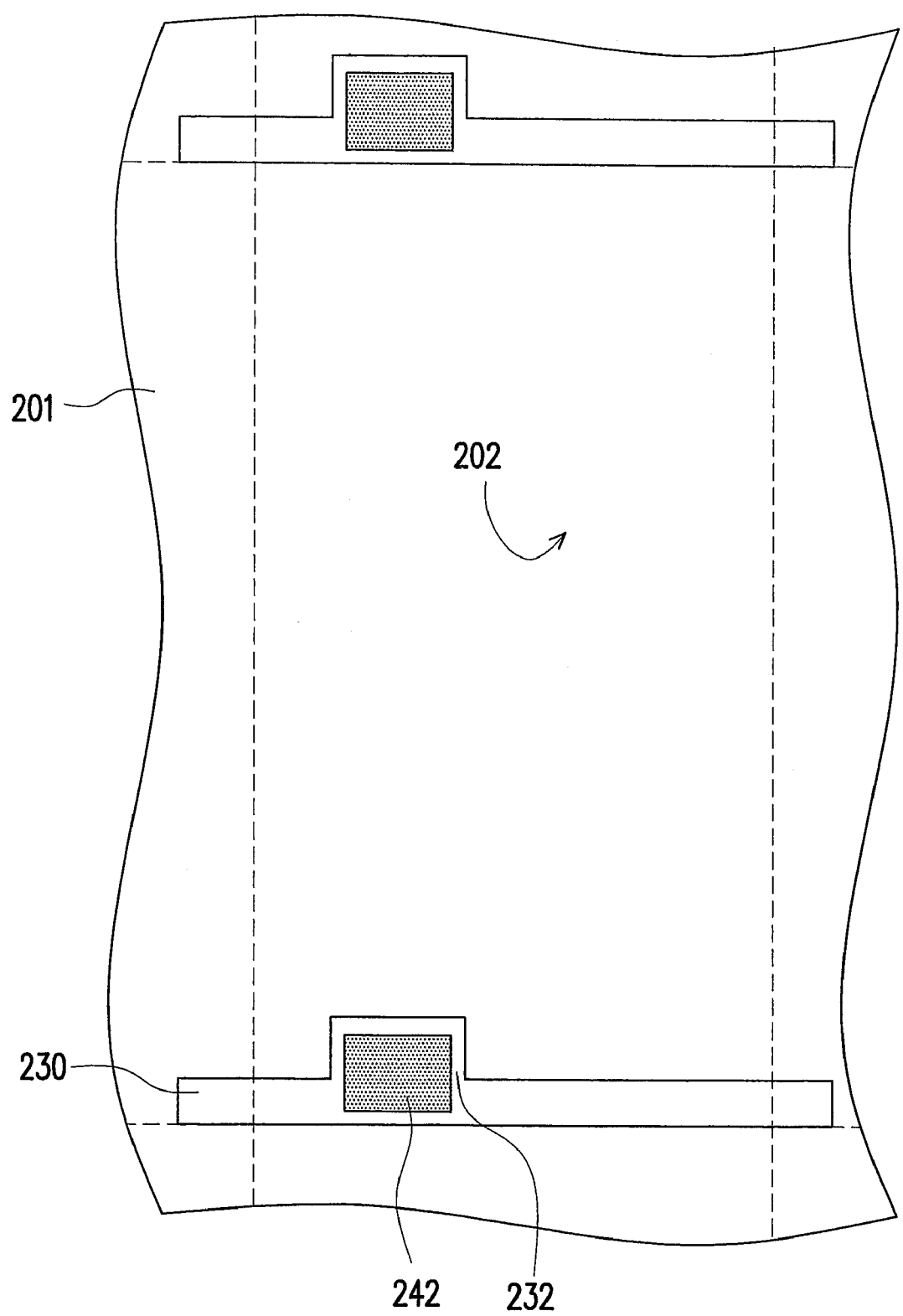

Referring to FIG. 7C, Step (G) is then performed to form the semiconductor layer 242 on the gate insulation layer 240 above the gate electrode 232. A method for fabricating the semiconductor layer 242 is, for example, forming a channel layer (not shown) on the gate insulation layer 240 above the gate electrode 232, and then forming an ohm contact layer (not shown) on the channel layer.

Figure 7D:
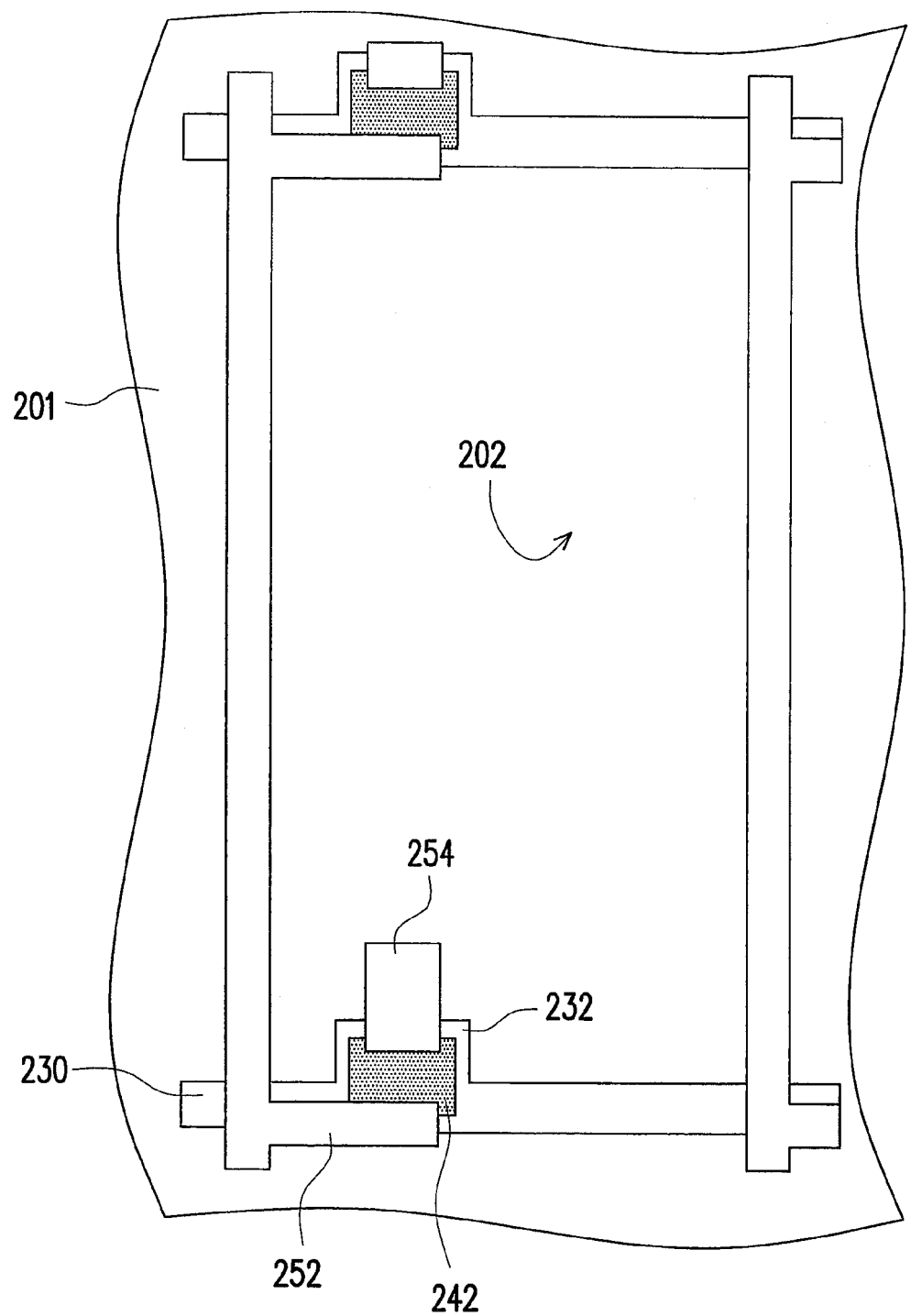

Thereafter, in FIG. 7D, Step (H) is carried out to form the data line 250, the source 252, and the drain 254 in each of the pixel areas 202. Specifically, the source 252 and the drain 254 are formed on two sides of the semiconductor layer 242.

Next, in Step (I), the second passivation layer 260, as shown in FIG. 6, is formed completely over the substrate 201 to cover the data line 250, the source 252, and the drain 254.

Figure 7E:
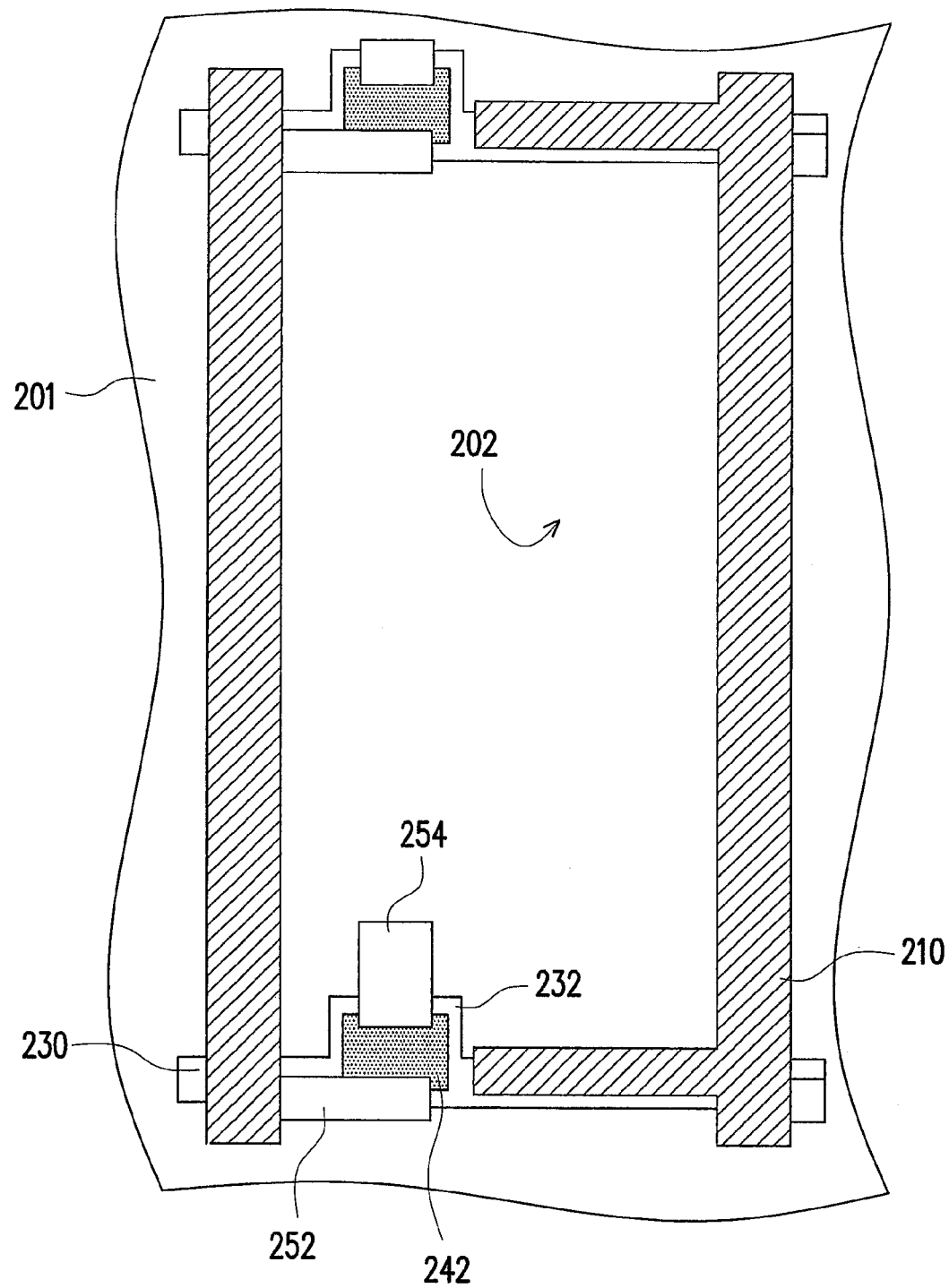

Following that, referring to FIG. 7E, Step (B) is carried out, and the common electrode 210 is formed on the second passivation layer 260 to surround each of the pixel areas 202. Because a part of the common electrode 210 is positioned above the data line 250, the data line 250 is covered by the common electrode 210 and cannot be seen from the top view. Moreover, in this embodiment, the common electrode 210 does not pass above the gate electrode 232, the source 252, and the drain 254, which constitute a thin-film transistor. A method for fabricating the common electrode 210 is, for example, forming a metal layer (not shown) completely over the substrate 201 and then patterning the metal layer by photolithography and etching processes.

Figure 7F:
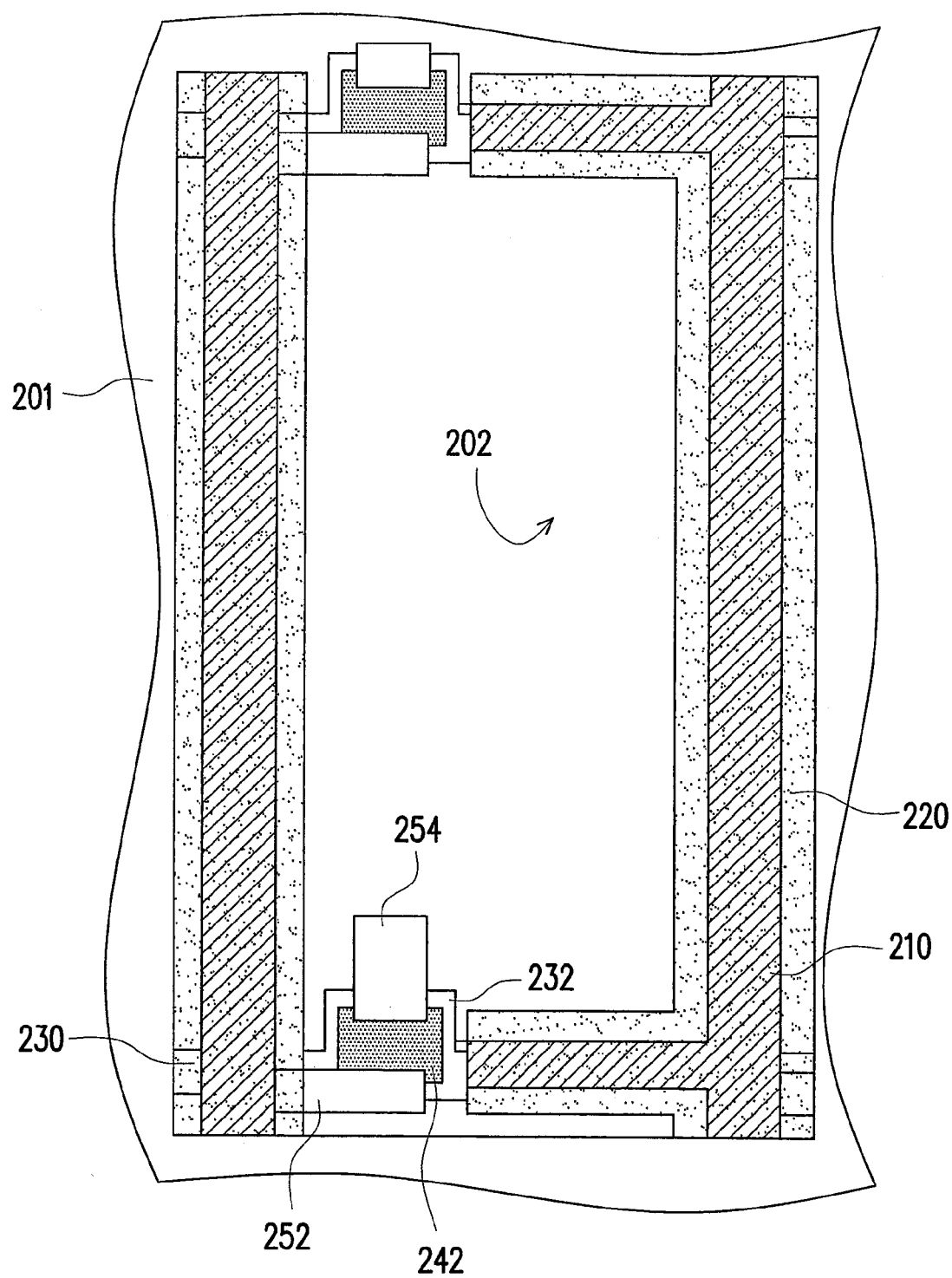

Thereafter, with reference to FIG. 7F, Step (C) is carried out, and the capacitance storage electrode 220 is formed on the common electrode 210. A method for fabricating the capacitance storage electrode 220 is, for instance: forming a transparent conductive layer (not shown) completely over the substrate 201 by a sputtering process and then patterning the transparent conductive layer by photolithography and etching processes.

Next, Step (D) is carried out, and the first passivation layer 225, as shown in FIG. 6, is formed completely over the substrate 201 to cover the capacitance storage electrode 220 and the common electrode 210. It is noted that the first passivation layer 225 also covers the second passivation layer 260.

Figure 7G:
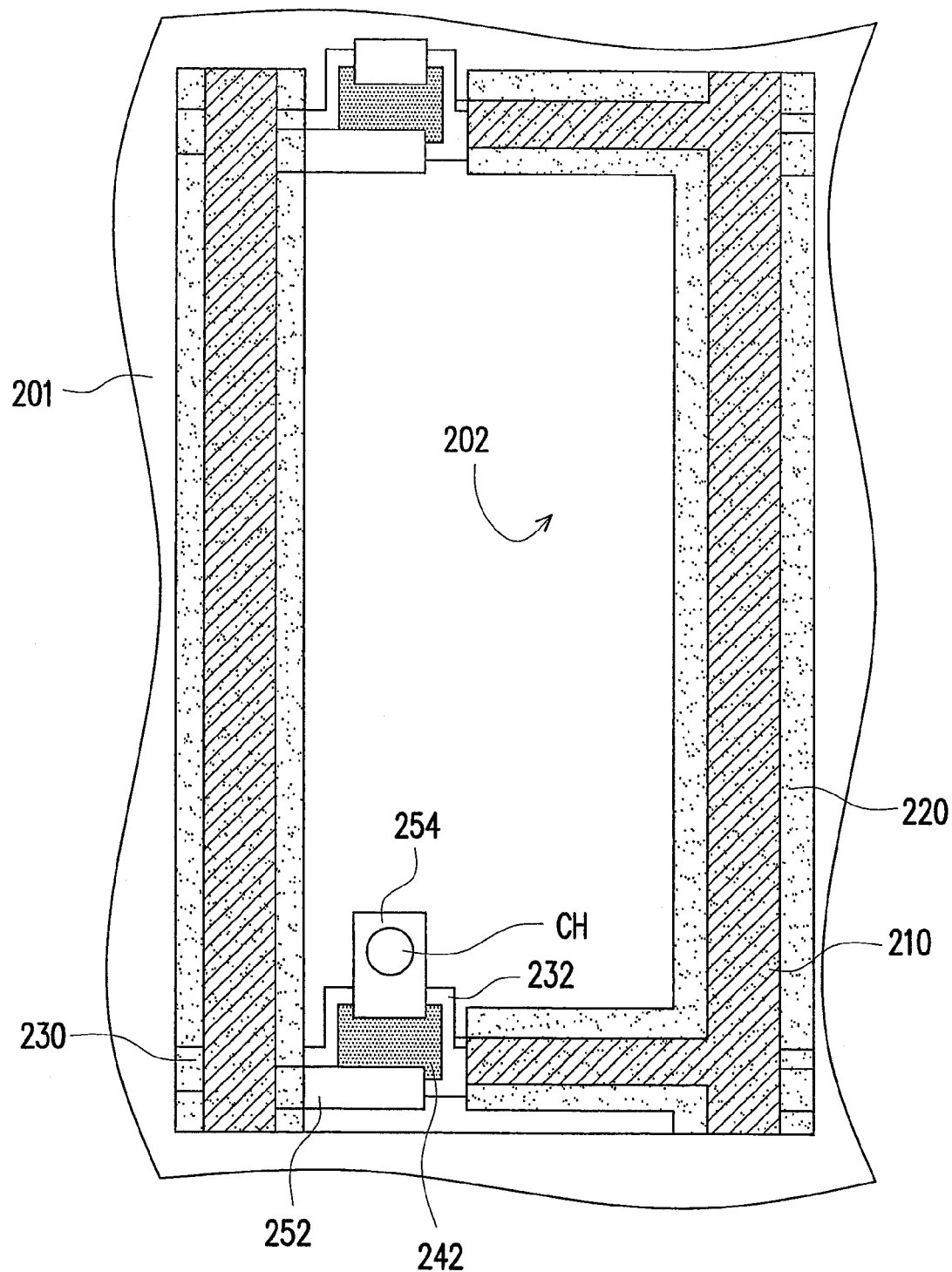

With reference to FIG. 7G, Step (J) is then performed, and the contact window CH is formed in the second passivation layer 260 and the first passivation layer 225 above the drain 254 for exposing the drain 254 (also see FIG. 6). The aforementioned contact window CH is formed by photolithography and etching processes, for instance.

Figure 7H:
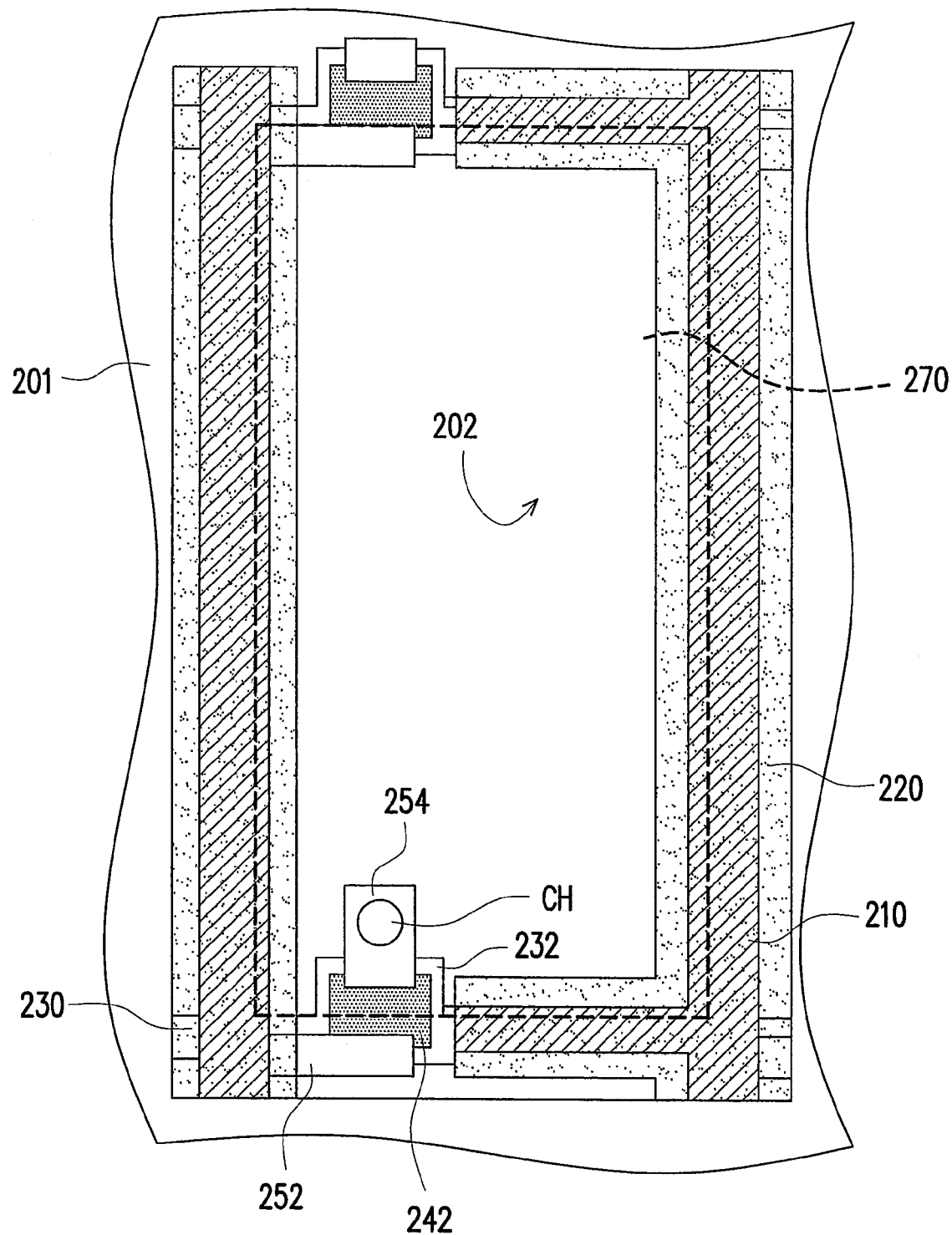

Further to the above, referring to FIGS. 6 and 7H, Step (K) is carried out, and the pixel electrode 270 (represented by dash lines in the drawings) is formed in each of the pixel areas 202. The pixel electrode 270 is electrically connected with the drain 254 through the contact window CH. Accordingly, the fabrication of the pixel structure 300 is completed.

It should be noted that, in the fabricating method of the second embodiment, Steps (B)~(D) are performed after Step (I). Moreover, in Step (J), the contact window CH is formed in the second passivation layer 260 and the first passivation layer 225 above the drain 254 to expose the drain 254.

Same as the pixel structure 200, the above-described pixel structure 300 has high aperture ratio and favorable storage capacitance. Since the common electrode 210 and the scan line 230 are not formed by the same photomask process, short circuit between the common electrode 210 and the scan line 230 is prevented.

Third Embodiment

Figure 8:
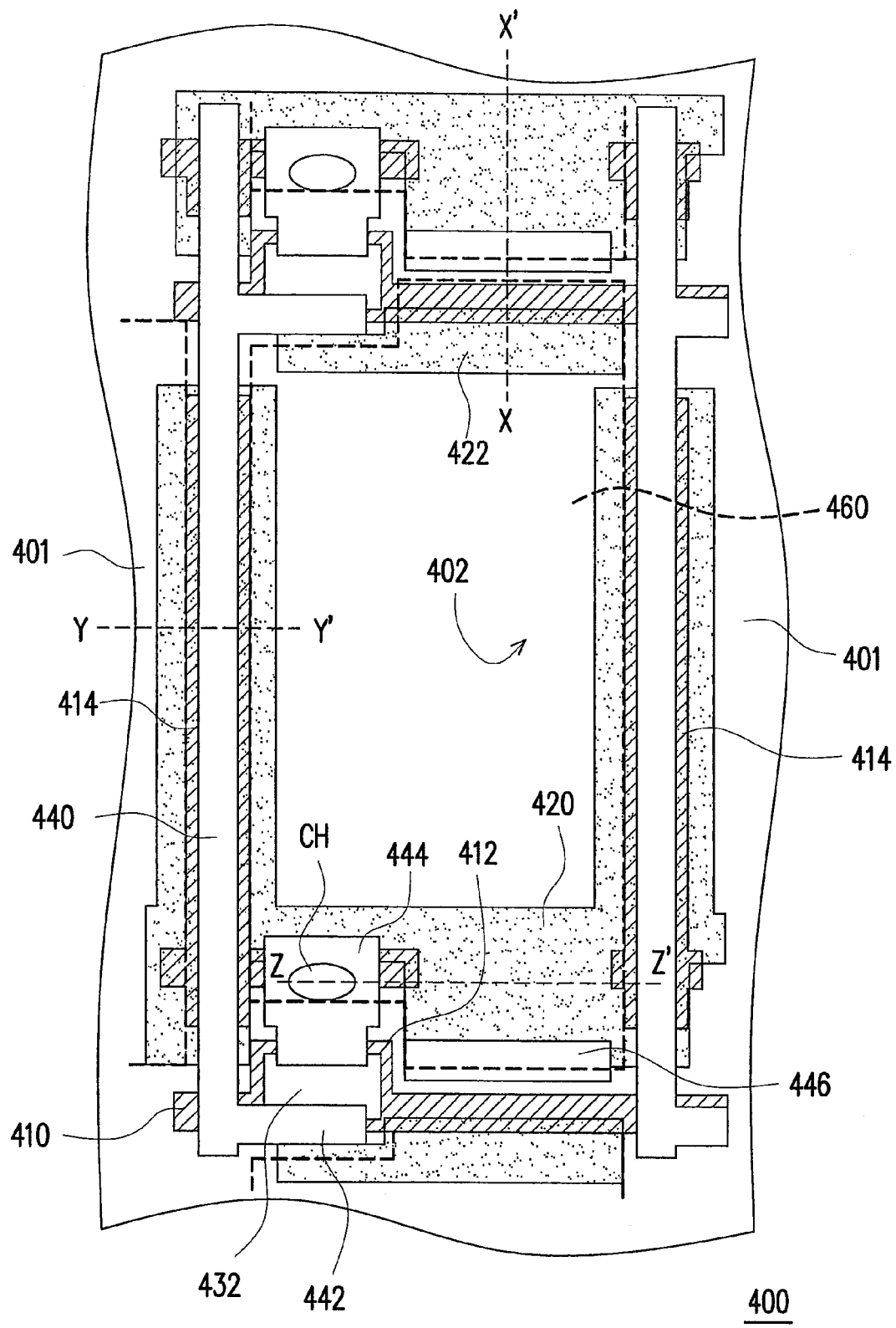
FIG. 8 is a schematic top view of a pixel structure according to the third embodiment of the invention.
Figure 9A:
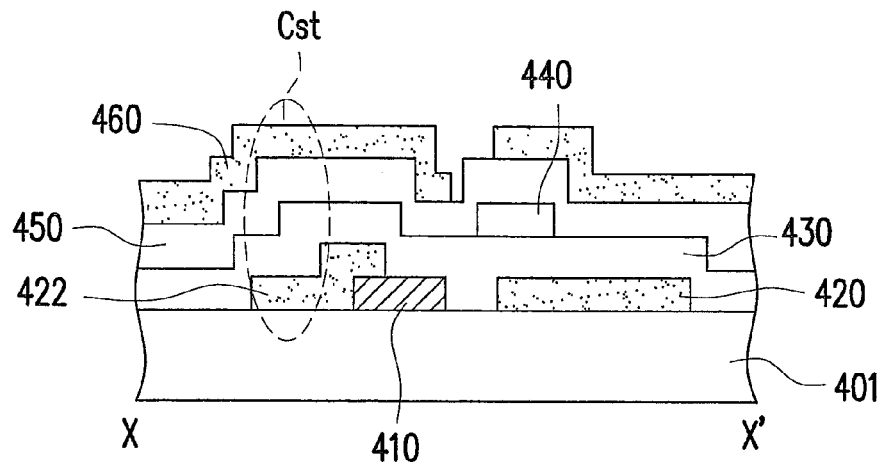
FIG. 9A~FIG. 9C are schematic cross-sectional views along Lines X-X', Y-Y', and Z-Z' in FIG. 8.
Figure 9B:
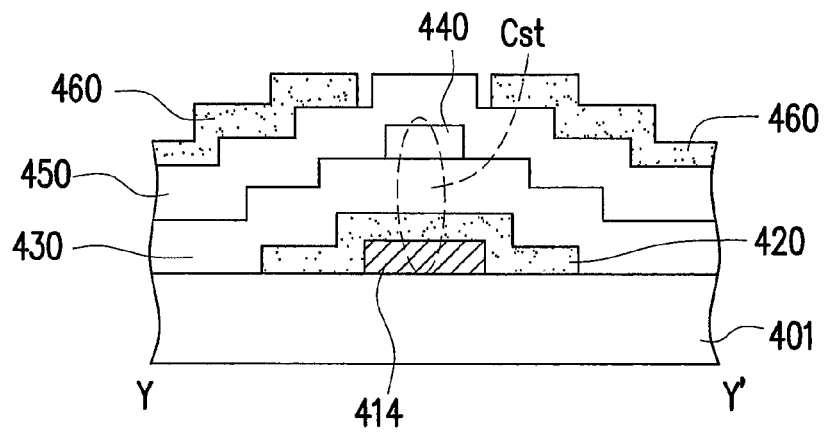
Figure 9C:
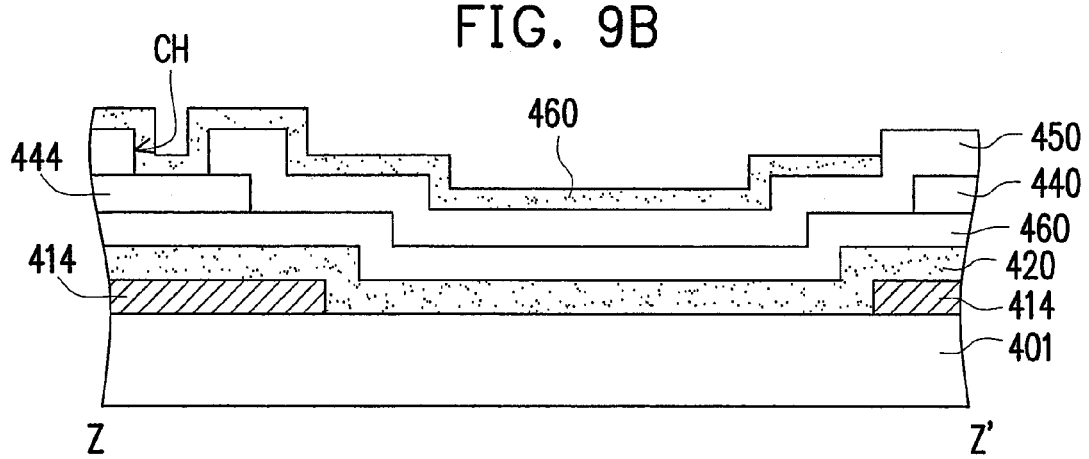

FIG. 8 is a schematic top view of a pixel structure according to the third embodiment of the invention. FIG. 9A~FIG. 9C are schematic cross-sectional views along Lines X-X', Y-Y', and Z-Z' in FIG. 8 respectively.

With reference to FIGS. 8 and 9A~9C, a pixel structure 400 is disposed on a substrate 401. The substrate 401 includes an array of a plurality of pixel areas 402, and the pixel structure 400 is disposed in each of the pixel areas 402. In order to simplify the description, FIG. 8 only depicts one of the pixel areas 402. The pixel structure 400 includes: a scan line 410, a gate electrode 412, at least a common electrode wire 414, a first capacitance storage electrode 420, a gate insulation layer 430, a semiconductor layer 432, a data line 440, a source 442, a drain 444, a passivation layer 450, and a pixel electrode 460.

The scan line 410, the gate electrode 412, and at least one common electrode wire 414 are disposed in each of the pixel areas 402, wherein the common electrode wire 414 is positioned only in a part of the pixel area 402. The first capacitance storage electrode 420 is disposed in each of the pixel areas 402, and the first capacitance storage electrode 420 is electrically connected between two adjacent common electrode wires 414. The gate insulation layer 430 covers the scan line 410, the gate electrode 412, the common electrode wire 414, and the first capacitance storage electrode 420. The semiconductor layer 432 is disposed on the gate insulation layer 430 above the gate electrode 412. The data line 440, the source 442, and the drain 444 are disposed in each of the pixel areas 402. Moreover, the source 442 and the drain 444 are disposed on two sides of the semiconductor layer 432. The passivation layer 450 is disposed on the substrate 401 and covers the data line 440, the source 442, and the drain 444, wherein the passivation layer 450 above the drain 444 has the contact window CH. The pixel electrode 460 is electrically connected with the drain 444 through the contact window CH.

The semiconductor layer 432 includes a channel layer (not shown) and an ohm contact layer (not shown), for example. Specifically, the channel layer is disposed on the gate insulation layer 430 above the gate electrode 412, and the ohm contact layer is disposed on the channel layer. However, the invention is not limited thereto. Persons having ordinary knowledge in the art should be able to understand the position of the semiconductor layer 432. Thus, detailed descriptions are omitted hereinafter.

The first capacitance storage electrode 420 is disposed corresponding to the data line 440. The first capacitance storage electrode 420, the gate insulation layer 430, and the data line 440 constitute a storage capacitance Cst, as shown in the Y-Y' cross-sectional view of FIG. 9B. The first capacitance storage electrode 420 extends into each of the pixel areas 402 and overlaps the pixel electrode 460 in a peripheral portion of each of the pixel areas 402, so as to provide a stable electric field to rotate the liquid crystal molecules in the overlap area.

Referring to FIGS. 8 and 9A~9C, the first capacitance storage electrode 420 is, for example, formed by light-transmissive indium tin oxide (ITO) or indium zinc oxide (IZO). Because two adjacent common electrode wires 414 are electrically connected by the first capacitance storage electrode 420, the opaque common electrode wires 414 are not required to cross over the whole pixel areas 402. Hence, the aperture ratio of the pixel structure 400 is improved. In one embodiment of the invention, the aperture ratio of the pixel structure 400 is up to about 68%.

The pixel structure 400 further includes a second capacitance storage electrode 422 disposed on the substrate 401 and located in the pixel areas 402. Moreover, the second capacitance storage electrode 422 is electrically connected to the scan line 410 of a previous pixel structure. The second capacitance storage electrode 422, the gate insulation layer 430, the passivation layer 450, and the pixel electrode 460 constitute a Cst on Gate, as shown in the X-X' cross-sectional view of FIG. 9A. The second capacitance storage electrode 422 is, for example, formed by light-transmissive indium tin oxide (ITO) or indium zinc oxide (IZO).

Referring to FIG. 8, the pixel structure 400 further includes a shielding layer 446 disposed between the gate insulation layer 430 and the passivation layer 450. The shielding layer 446 is parallel to the scan line 410 and adjacent to an edge of each of the pixel areas 402. The shielding layer 446 prevents light leakage which results from the liquid crystal molecules affected by a non-uniform electric field. The invention does not limit the positions of the second capacitance storage electrode 422 and the shielding layer 446. Some of the embodiments do not require the second capacitance storage electrode 422 or the shielding layer 446, or require only one of the foregoing.

FIG. 10A~FIG. 10G illustrate a method of fabricating the pixel structure according to the third embodiment of the invention In order to simplify the description, only one of the pixel areas is depicted in the drawings.

Figure 10A:
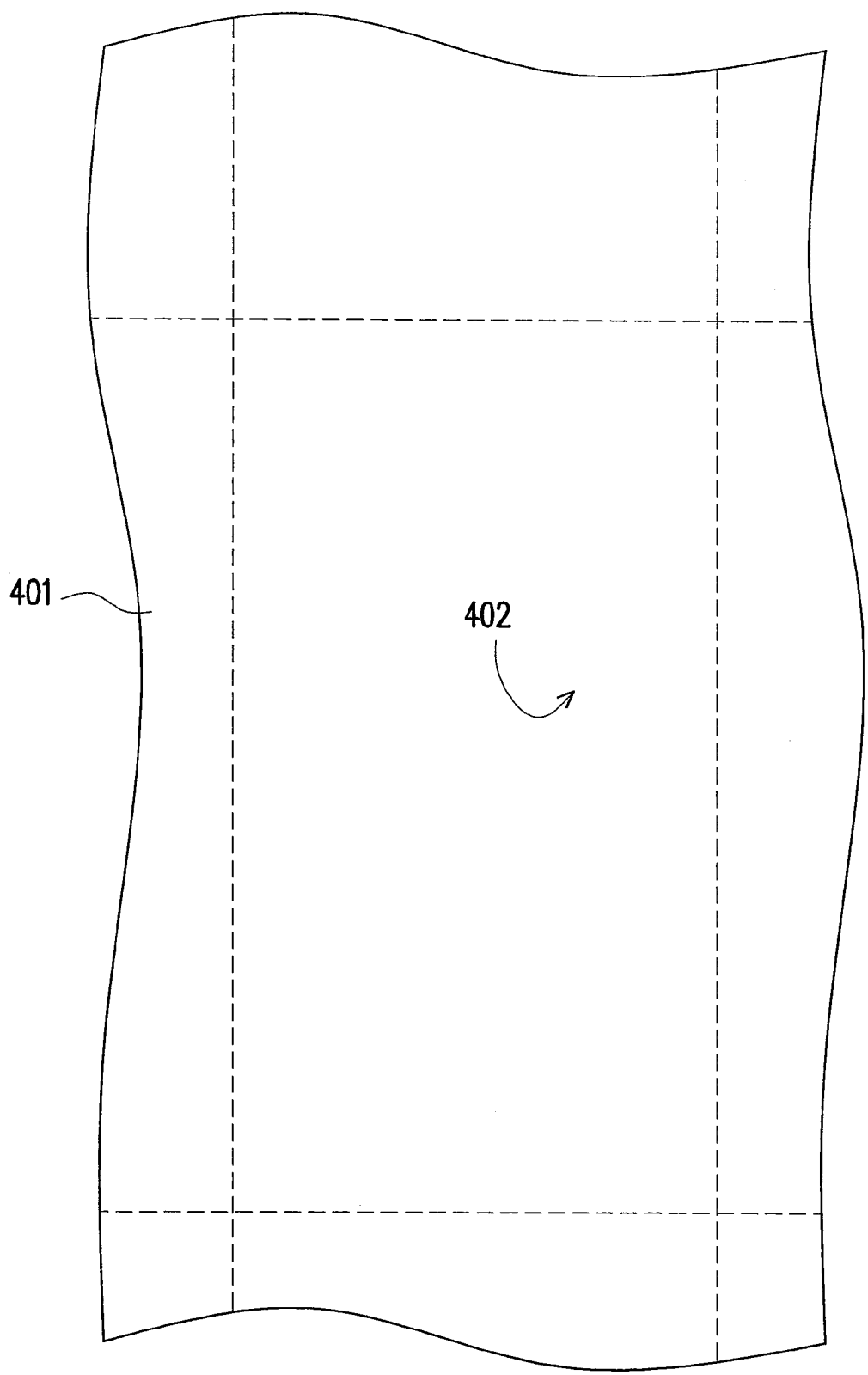
FIG. 10A~FIG. 10G illustrate a method of fabricating the pixel structure according to the third embodiment of the invention

First, referring to FIG. 10A, the substrate 401 having an array of a plurality of pixel areas 402 is provided.

Figure 10B:
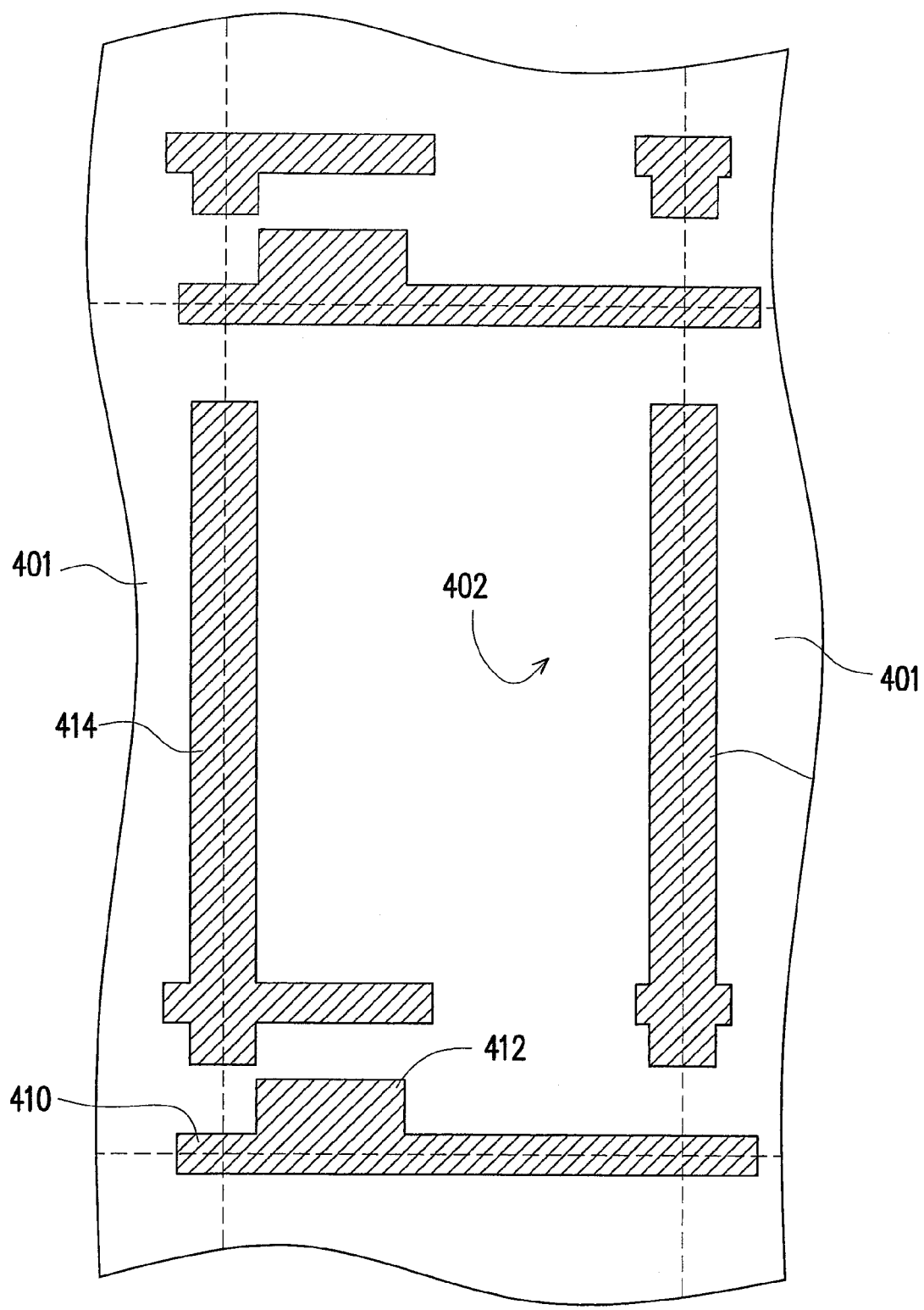

Next, referring to FIG. 10B, the scan line 410, the gate electrode 412, and at least one common electrode wire 414 are formed in each of the pixel areas 402, wherein the common electrode wire 414 is positioned only in a part of the pixel area 402.

Figure 10C:
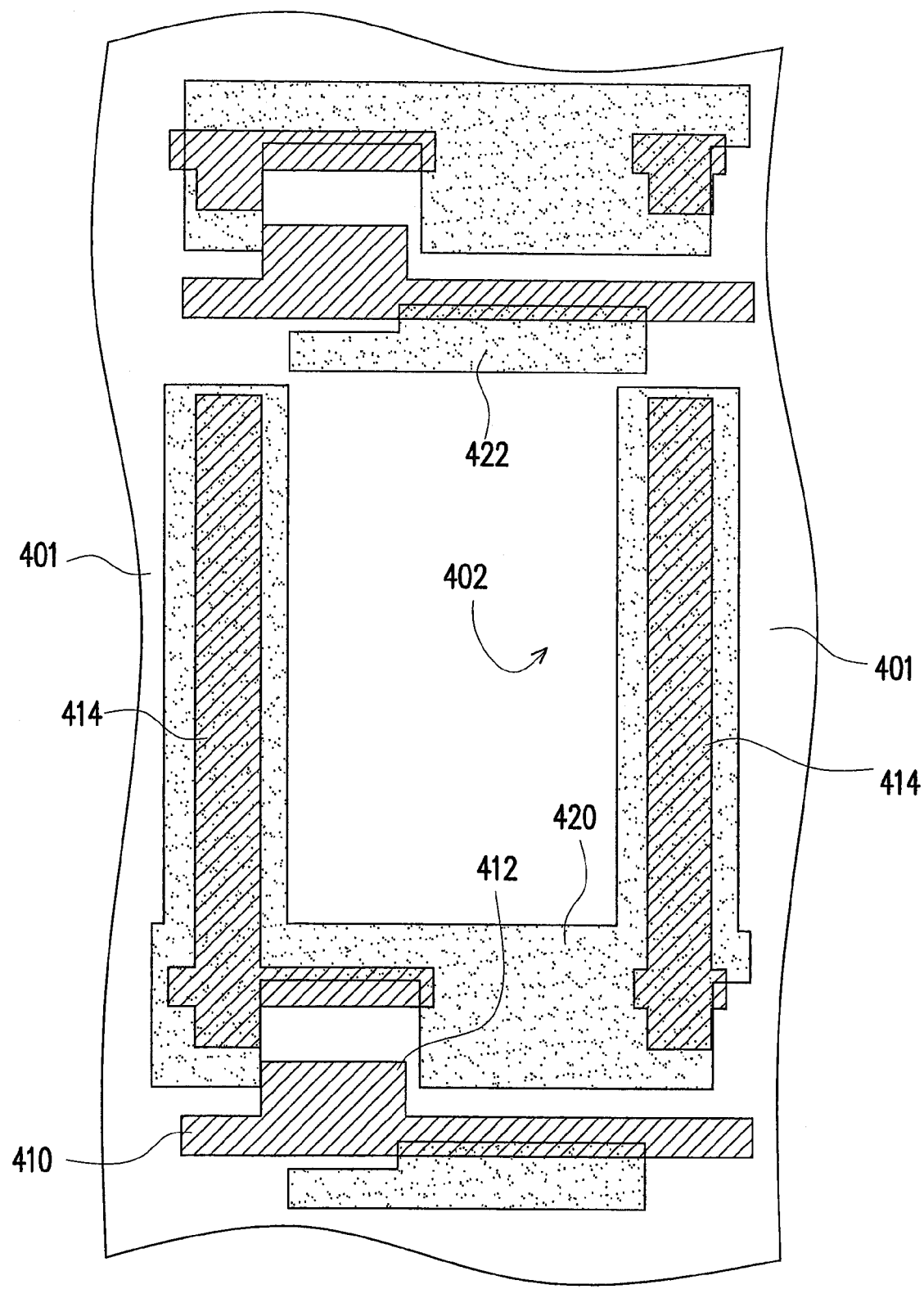

Thereafter, referring to FIG. 10C, the first capacitance storage electrode 420 is formed in each of the pixel areas 402. The first capacitance storage electrode 420 is electrically connected between two adjacent common electrode wires 414.

In this embodiment, the step as shown in FIG. 10C further includes forming the second capacitance storage electrode 422 in the pixel areas 402 on the substrate 401. The second capacitance storage electrode 422 is electrically connected with the scan line 402 of a previous pixel structure 400. The second capacitance storage electrode 422, the gate insulation layer 430, and the pixel electrode 460 constitute a Cst on Gate, as shown in the X-X' cross-sectional view of FIG. 9A. However, the invention is not limited to the above descriptions. In some of the embodiments, the second capacitance storage electrode 422 is not required.

Then, the gate insulation layer 430 as shown in FIGS. 9A~9C is formed completely over the substrate 401 to cover the scan line 410, the gate electrode 412, the common electrode wire 414, and the first capacitance storage electrode 420.

Figure 10D:
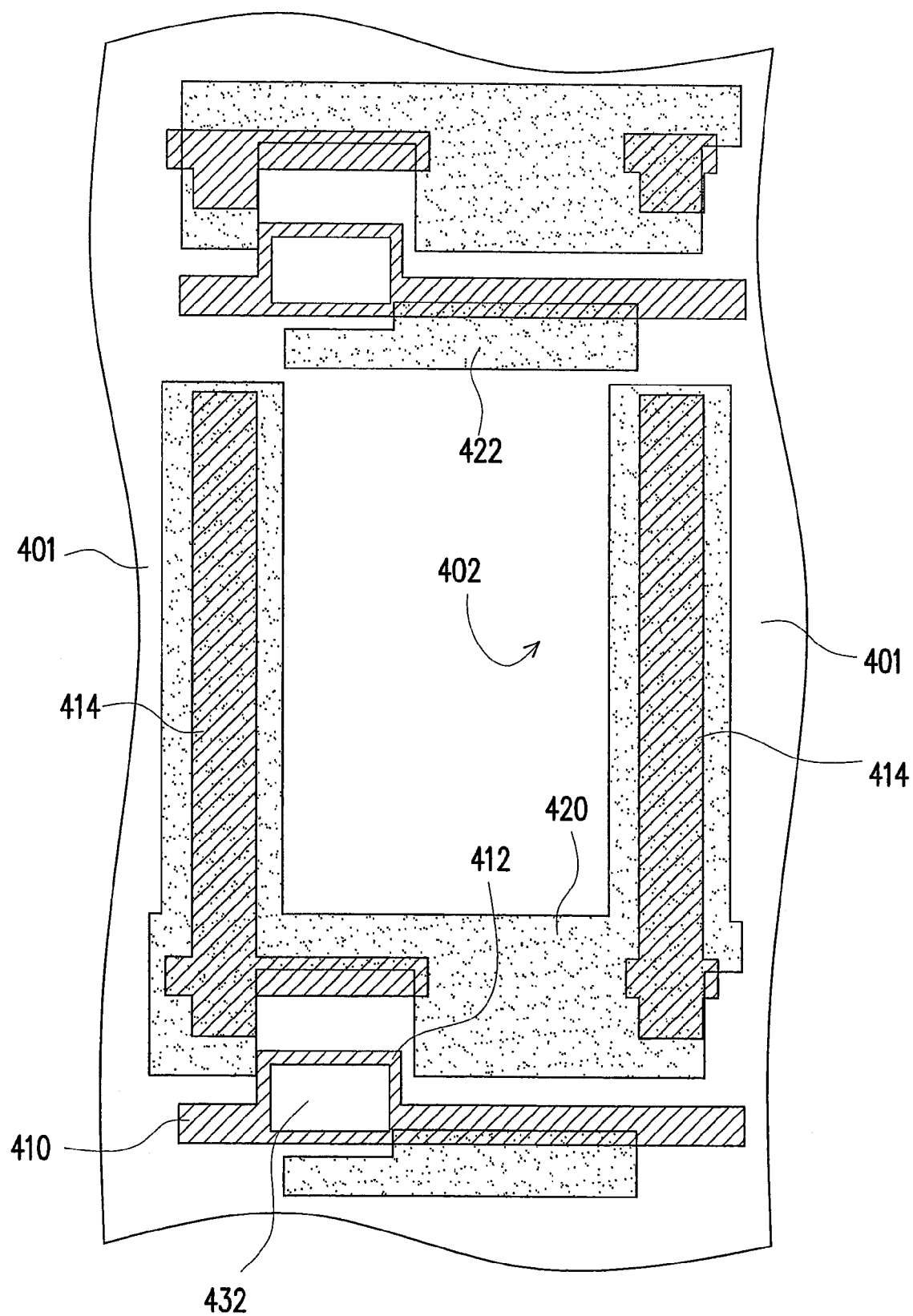

Following that, referring to FIG. 10D, the semiconductor layer 432 is formed on the gate insulation layer 430 above the gate electrode 412. A method for fabricating the semiconductor layer 432 includes forming a channel layer on the gate insulation layer 430 above the gate electrode 412, and then forming an ohm contact layer on the channel layer, for example.

Figure 10E:
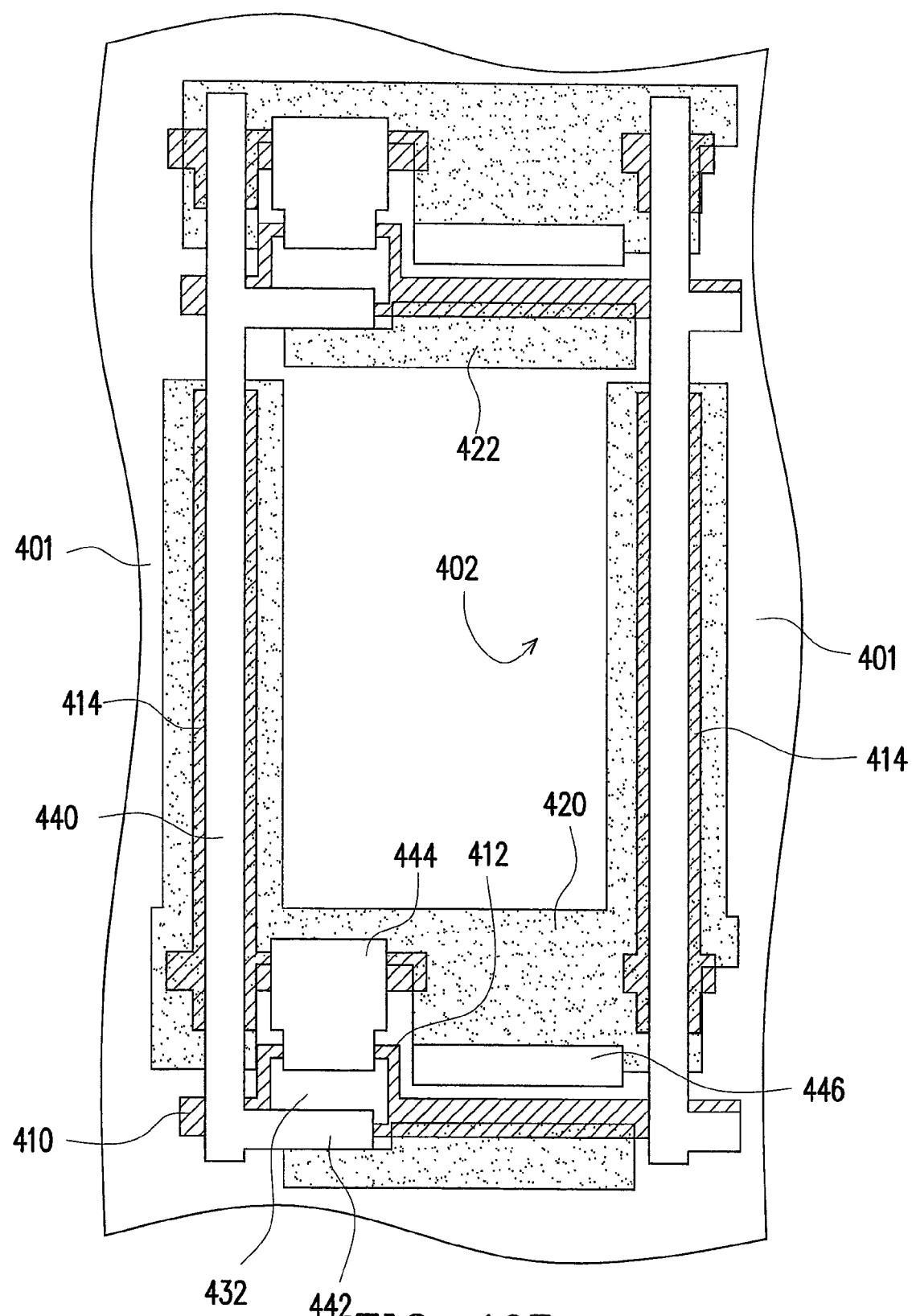

Thereafter, referring to FIG. 10E, the data line 440, the source 442, and the drain 444 are formed in each of the pixel areas 402. Specifically, the source 442 and the drain 444 are formed on two sides of the semiconductor layer 432. In this embodiment, the step in FIG. 10E further includes forming the shielding layer 446 between the gate insulation layer 430 and the passivation layer 450, as shown in the X-X' cross-sectional view of FIG. 9A. The shielding layer 446 is parallel to the scan line 410 and adjacent to the edge of each of the pixel areas 402.

Figure 10F:
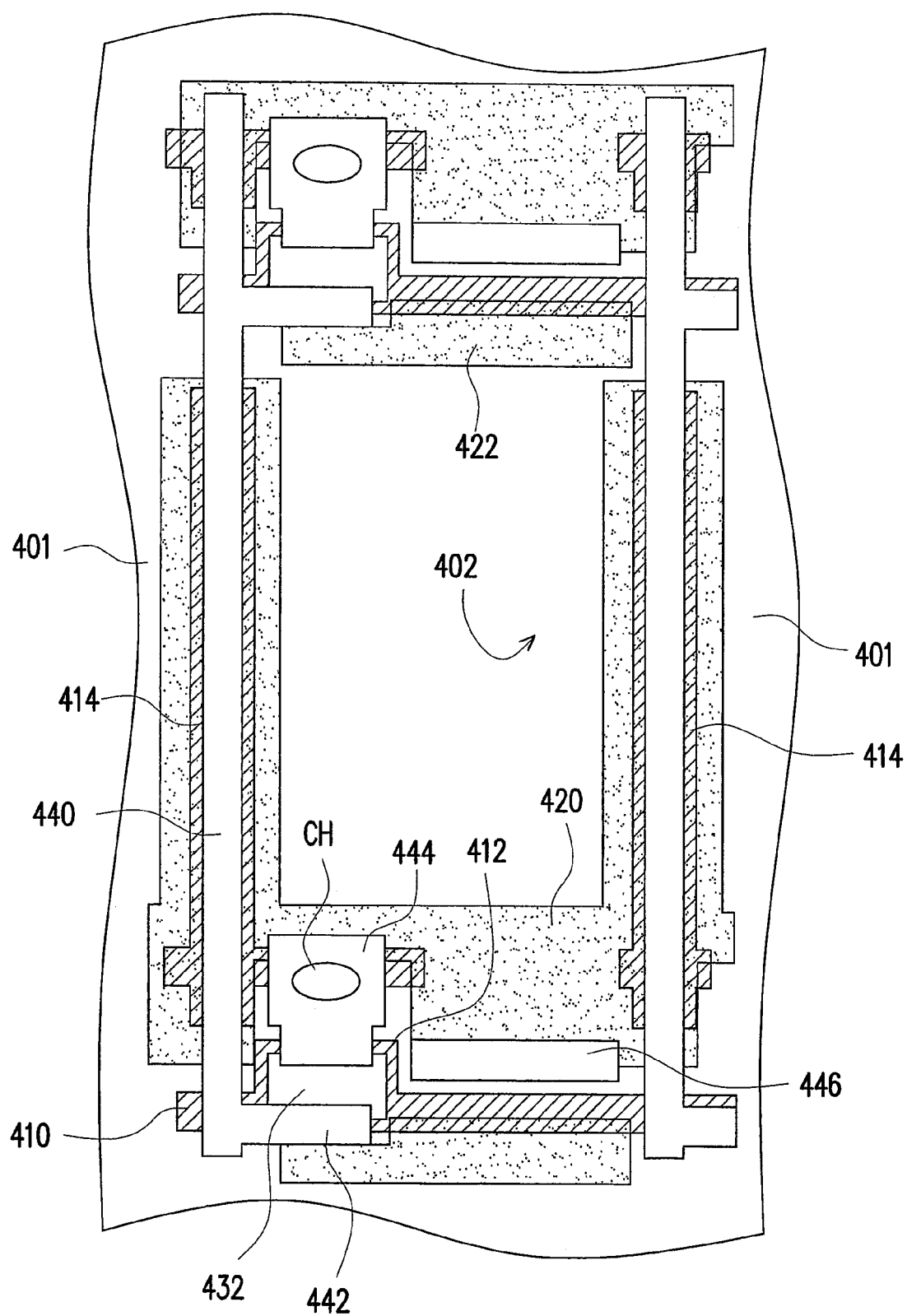

Further to the above, the passivation layer 450 is formed completely over the substrate 401, as shown in FIG. 10F (also see FIGS. 9A~9C), to cover the data line 440, the source 442, and the drain 444.

Following that, with reference to FIG. 10F, the contact window CH is formed in the passivation layer 450 above the drain 444 to expose the drain 444 (also see FIGS. 9A–9C).

Figure 10G:
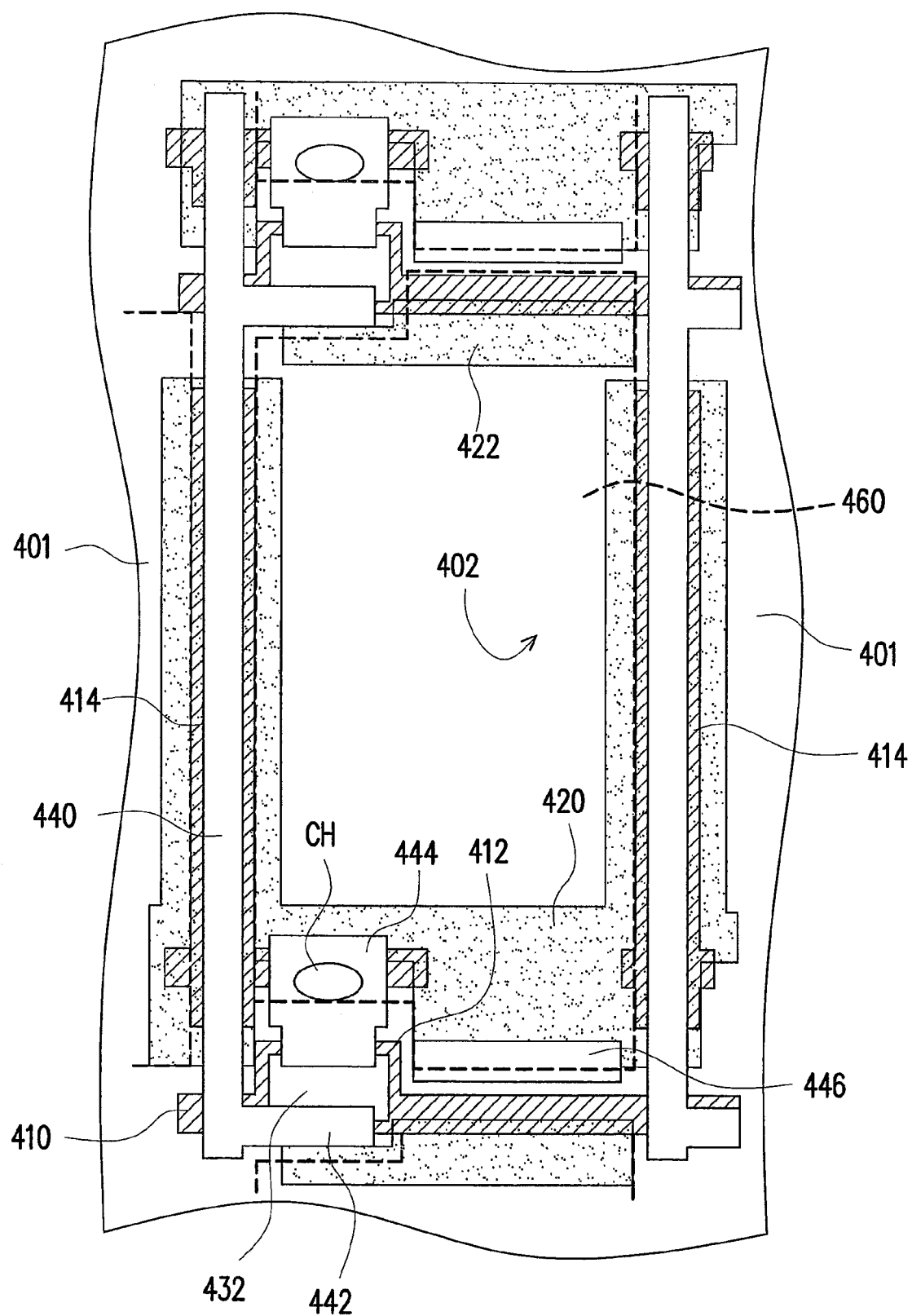

Then, referring to FIG. 10G, the pixel electrode 460, as indicated by dash lines, is formed in each of the pixel areas 402. The pixel electrode 460 is electrically connected with the drain 444 through the contact window CH. Accordingly, the fabrication of the pixel structure 400 is completed.

Compared with the conventional fabricating methods, a step of forming the first capacitance storage electrode 420 is added to the fabricating method in the third embodiment of the invention. In other words, six photomask processes are used to fabricate the pixel structure 400 in the first embodiment of the invention. However, it is noted that the invention does not limit the number of the photomask processes used during the fabrication. Since the common electrode wire 414 and the first capacitance storage electrode 420 in the pixel structure 400 and the scan line 410 are formed by different photomask processes, short circuit between the common electrode wire 414, the first capacitance storage electrode 420, and the scan line 410 is avoided.

In conclusion of the above, the pixel structure of the invention and the fabricating method thereof at least possess the following advantages:

In the pixel structure of the invention, the common electrode is disposed around the pixel areas and corresponding to the scan line and the data line. The common electrode does not shield the central parts of the pixel areas. Hence, the aperture ratio of the pixel structure is increased, and power consumption is reduced. In addition, the storage capacitance formed therein can maintain favorable display quality. Compared with the conventional technology, the fabricating method of the invention includes one to two additional photomask processes. That is, in the method, additional photomask processes are carried out to form the common electrode and the capacitance storage electrode. Since the common electrode and the scan line are not fabricated by the same photomask process, the short circuit between the common electrode and the scan line is prevented to increase production yield rate.

Although the invention has been described with reference to the above embodiments, it is apparent to one of ordinary skill in the art that modifications to the described embodiments may be made without departing from the spirit of the invention. Accordingly, the scope of the invention is defined by the attached claims not by the above detailed descriptions.

What is claimed is:

1. A pixel structure, disposed on a substrate having an array of a plurality of pixel areas, the pixel structure being disposed in each of the pixel areas, the pixel structure comprising:
   a scan line, a gate electrode, and at least a common electrode wire disposed in each of the pixel areas, wherein the common electrode wire is positioned only in a portion of the pixel area;
   a first capacitance storage electrode disposed in each of the pixel areas, the first capacitance storage electrode being electrically connected between two adjacent common electrode wires;
   a gate insulation layer covering the scan line, the gate electrode, the common electrode wire, and the first capacitance storage electrode;
   a semiconductor layer disposed on the gate insulation layer above the gate electrode;
   a data line, a source, and a drain disposed in each of the pixel areas, the source and the drain being disposed on two sides of the semiconductor layer;
   a passivation layer disposed on the substrate to cover the data line, the source, and the drain, wherein the passivation layer above the drain has a contact window; and
   a pixel electrode electrically connected with the drain through the contact window.

2. The pixel structure as claimed in claim 1, further comprising:
   a second capacitance storage electrode disposed on the substrate; the second capacitance storage electrode being disposed in the pixel area and electrically connected with the scan line of a previous pixel structure,
   wherein the second capacitance storage electrode, the gate insulation layer, and the pixel electrode form a Cst on Gate.

3. The pixel structure as claimed in claim 1, wherein the first capacitance storage electrode is disposed corresponding to the data line; the first capacitance storage electrode, the gate insulation layer, and the data line form a storage capacitance.

4. The pixel structure as claimed in claim 1, further comprising:
   a shielding layer, disposed between the gate insulation layer and the passivation layer; the shielding layer being parallel to the scan line and adjacent to an edge of each of the pixel areas.

5. The pixel structure as claimed in claim 1, wherein the semiconductor layer comprises:
   a channel layer disposed on the gate insulation layer above the gate electrode; and
   an ohm contact layer disposed on the channel layer.

6. The pixel structure as claimed in claim 1, wherein the first capacitance storage electrode extends into each of the pixel areas and overlaps the pixel electrode in a peripheral portion of each of the pixel areas.

* * * * *